United States Patent
Maegawa et al.

(10) Patent No.: US 6,869,865 B2
(45) Date of Patent: Mar. 22, 2005

(54) METHOD OF MANUFACTURING SEMICONDUCTOR DEVICE

(75) Inventors: Shigeto Maegawa, Tokyo (JP); Takashi Ipposhi, Tokyo (JP); Kazunobu Ohta, Tokyo (JP); Yasuo Inoue, Tokyo (JP); Masanobu Kohara, Osaka (JP); Takashi Eura, Osaka (JP); Natsuro Tsubouchi, 2-2-45, Seiwadainishi, Kawanishi, Hyogo (JP)

(73) Assignees: Renesas Technology Corp., Tokyo (JP); Ion Engineering Research Institute Corporation, Hirakata (JP); Natsuro Tsubouchi, Kawanishi (JP)

( * ) Notice: Subject to any disclaimer, the term of this patent is extended or adjusted under 35 U.S.C. 154(b) by 0 days.

(21) Appl. No.: 10/608,154

(22) Filed: Jun. 30, 2003

(65) Prior Publication Data

US 2004/0087118 A1 May 6, 2004

(30) Foreign Application Priority Data

Nov. 6, 2002 (JP) .................................... 2002-322486

(51) Int. Cl.⁷ ........................................... H01L 21/425
(52) U.S. Cl. ...................... 438/514; 438/535; 438/550; 438/798
(58) Field of Search ................................ 438/514, 535, 438/550, 798

(56) References Cited

U.S. PATENT DOCUMENTS 6,011,810 A * 1/2000 Haller et al. ................. 372/45
6,255,201 B1 * 7/2001 Yoshida et al. ............. 438/535
6,483,100 B1 * 11/2002 Williams et al. ......... 250/214.1

FOREIGN PATENT DOCUMENTS

JP            10-214785            8/1998

OTHER PUBLICATIONS

Y. Setsuhara, et al., Extended Abstracts of International Workshop on Junction Technology, pp. 103–106, "Coherent Phonon Excitation As Nonequillibrium Dopant Activation Process For Ultra–Shallow Junction Formation", 2001.

* cited by examiner

Primary Examiner—George Fourson
Assistant Examiner—Michelle Estrada
(74) Attorney, Agent, or Firm—Oblon, Spivak, McClelland, Maier & Neustadt, P.C.

(57) ABSTRACT

Activation of impurities is achieved without involving creation of a crystal defect or deformation by using phonon absorption. A laser beam (42) having a wavelength in a range of 16 to 17 μm is irradiated onto silicon, to cause phonon absorption. Before an energy supplied from the laser beam (42) diffuses around a portion which is irradiated with the laser beam (42), solid phase epitaxy in the portion finishes. Accordingly, crystallization occurs only in the portion which is irradiated with the laser beam (42), and does not occur in a portion which is not irradiated with the laser beam (42). Hence, heat is not excessively absorbed. Also, local phase change such as melting and solidification is not caused.

19 Claims, 20 Drawing Sheets

F I G . 7
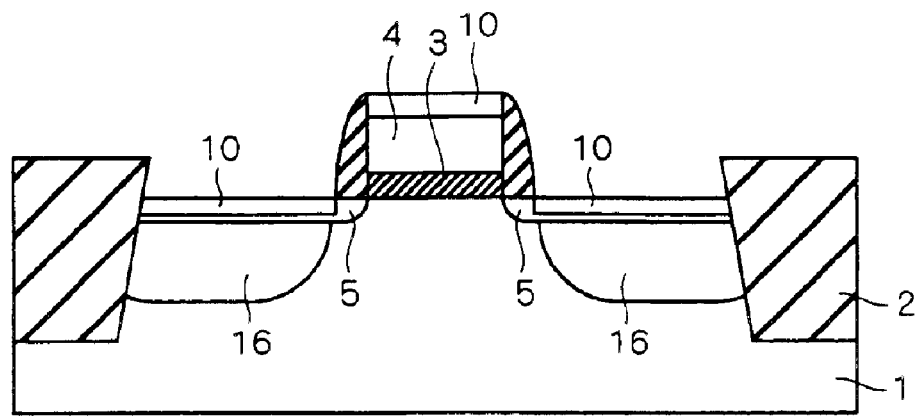
F I G . 8
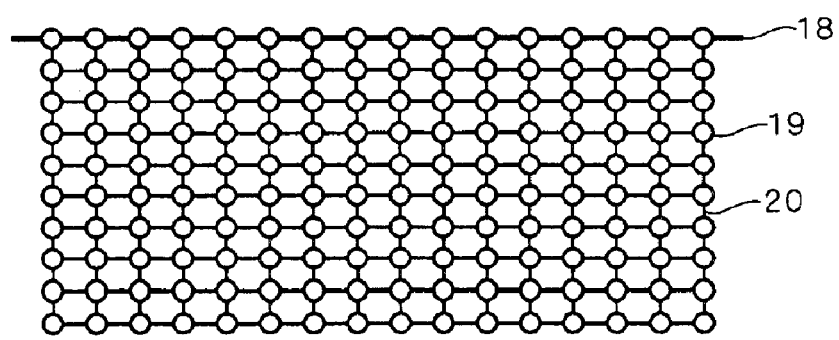

F I G . 1 1
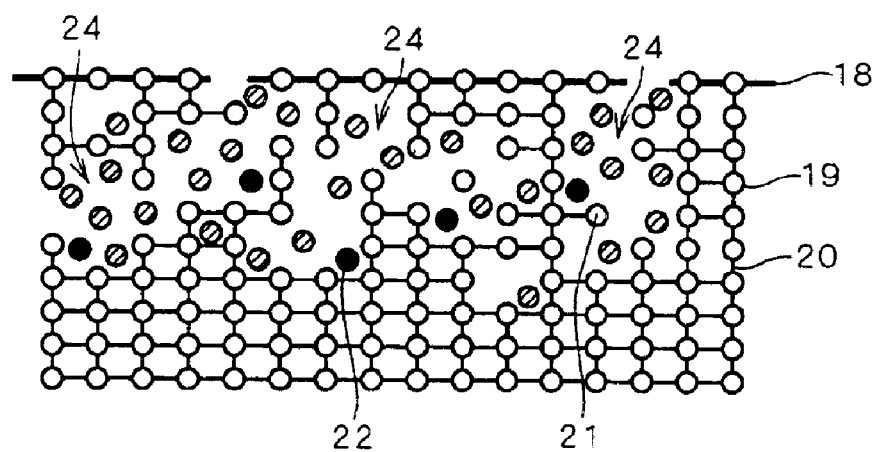
F I G . 1 2
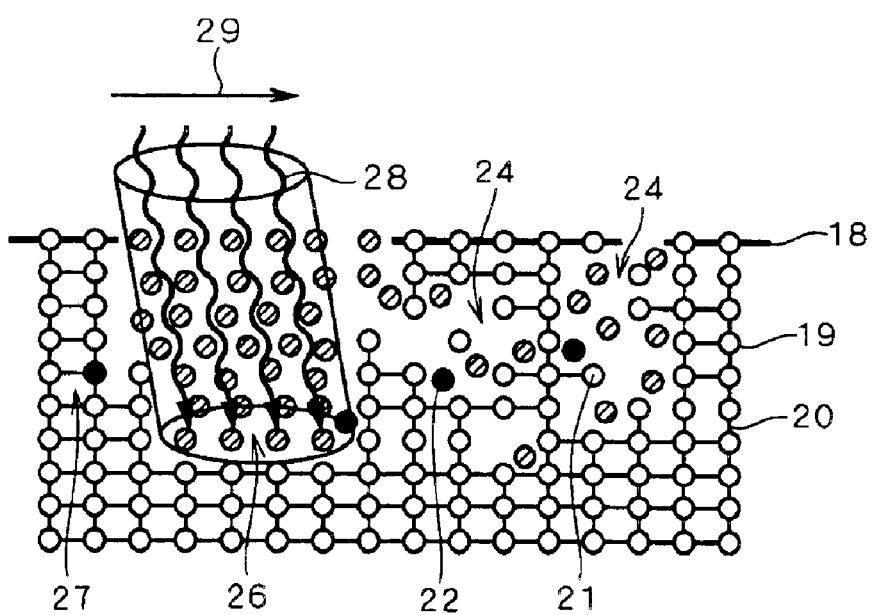

F I G. 3 4
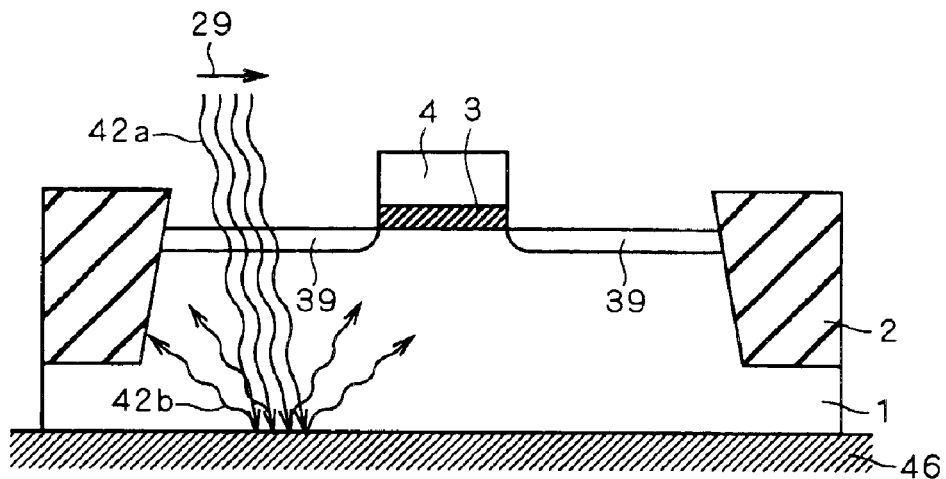
F I G. 3 5
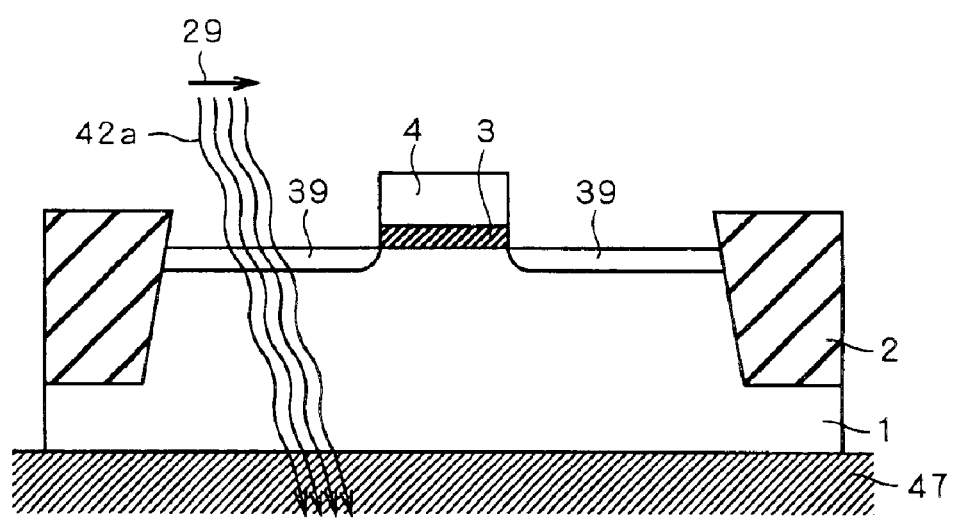

METHOD OF MANUFACTURING SEMICONDUCTOR DEVICE

BACKGROUND OF THE INVENTION

1. Field of the Invention

The present invention relates to a method of manufacturing a semiconductor device.

2. Description of the Background Art

Miniaturization of a transistor is needed to increase an integration density and an operation speed and to reduce power consumption, for a semiconductor device. To this end, various aspects in a technology for manufacturing a semiconductor device have been adapted so as to achieve miniaturization of a transistor.

Formation of a pn junction is one of significant processes in manufacture of a semiconductor device, and there has been a demand for miniaturizing also a pn junction. In this regard, it is desirable to form a pn junction so as to be as shallow as possible from a surface of a semiconductor, which is one example of attempts to miniaturize a pn junction. For example, when a design rule is 80 nm, the pn junction will be formed at a depth about 20 nm from a surface of a semiconductor.

Formation of a pn junction is broadly divided into two processes of: an impurity introduction process in which impurities are introduced into a semiconductor by ion implantation, for example; and an activation process in which the impurities as introduced are activated. Hence, there has been a strong demand for specific techniques for an impurity introduction process and an activation process, in order to form a pn junction at the above noted depth. In particular, as for an impurity introduction process, demanded is a technique for accomplishing ion implantation at a low energy which allows for control of a depth to which ions are implanted such that the depth falls within a range from several nanometers to a dozen or so nanometers. As for an activation process, demanded is a technique for accomplishing activation of introduced impurities while repairing a crystal defect created in a semiconductor due to ion implantation without allowing implanted atoms to diffuse. As one example of a technique for an activation process, a technique utilizing phonon absorption is cited, which is described in Japanese Patent Application Laid-Open No. 10-214785, and in "Coherent Phonon Excitation as Non-equillibrium Dopant Activation Process for Ultra-Shallow Junction Formation" by Y. Setsuhara et al., Proc. of Extended Abstract of International Workshop on Junction Technology 2001, Japan Society of Applied Physics pp. 103–106.

To perform an activation process, annealing by irradiation with a lamp (hereinafter, referred to as "lamp annealing") or local melting using a laser light has typically been employed. Such conventional techniques, however, have caused problems of newly creating a crystal defect or inviting deformation of a semiconductor.

SUMMARY OF THE INVENTION

It is an object of the present invention to provide a new technique for activating impurities by using phonon absorption, without creating a crystal defect and inviting deformation.

A method of manufacturing a semiconductor device according to the present invention includes a step of (a) forming a first impurity layer and a step of (b) irradiating a coherent light onto a semiconductor under the first impurity layer. In the step (a), first impurities which impart a first conductivity type to the semiconductor are introduced into the semiconductor. The coherent light to be irradiated in the step (b) has a wavelength at which multi-phonon lattice absorption of the semiconductor occurs.

Alternatively, the method of manufacturing a semiconductor device according to the present invention includes a step of (a) forming an impurity layer and a step of (b) irradiating a first laser light onto a silicon layer. In the step (a), impurities are introduced into a surface of the silicon layer having a first conductivity type, and the impurities impart a second conductivity type opposite to the first conductivity type to the silicon layer to form the impurity layer. The first laser light to be irradiated in the step (b) has a wavelength in a range of 16 to 17 $\mu$m.

The method of manufacturing a semiconductor device according to the present invention makes it possible to decrease crystal defects created in the semiconductor during introduction of the first impurities, by using multi-phonon lattice absorption.

Also, lattice vibration of the silicon layer by phonon is caused, which makes it possible to activate the impurity layer without inviting thermal diffusion of the introduced impurities. Hence, a pn junction can be formed extremely close to a surface of the silicon layer. Further, the surface of the silicon layer is not molten, which prevents a crystal defect from being created due to solidification. Moreover, even if polysilicon is additionally provided as a conductor, such polysilicon is not molten, to be escaped from deformation. Since the first laser light having a wavelength in a range of 16 to 17 $\mu$m transmits through silicon at a high transmittance, activation of the impurity layer can be surely achieved even if the impurity layer is formed far away from the surface of the silicon layer.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 2 through 7 are sectional views for illustrating procedures for manufacturing the MOS transistor.

FIGS. 8 and 13 diagrammatically illustrate crystal structures of an area near a surface of a silicon wafer in respective states.

FIG. 34 is a sectional view for illustrating a first example of a method of manufacturing a semiconductor device according to a fifth preferred embodiment of the present invention.

FIG. 35 is a sectional view for illustrating a second example of the method of manufacturing a semiconductor device according to the fifth preferred embodiment of the present invention.

DESCRIPTION OF THE PREFERRED EMBODIMENTS

Preferred Embodiments

<A. Example of a Semiconductor Device to which the Present Invention is Applicable>

Prior to describing preferred embodiments of the present invention in detail, a MOS transistor as an example of a semiconductor device to which the present invention is applicable will be explained. While the following explanation refers to a MOS transistor of a type in which a pn junction is formed by forming an N-type diffusion layer in a P-type substrate, the present invention is applicable also to a MOS transistor of another type in which a pn junction is formed by forming a P-type diffusion layer in an N-type silicon substrate or an N-type diffusion layer, of course. In such a case, the following explanation can be used by reading respective conductivities noted in the explanation as being opposite.

Figure 1:
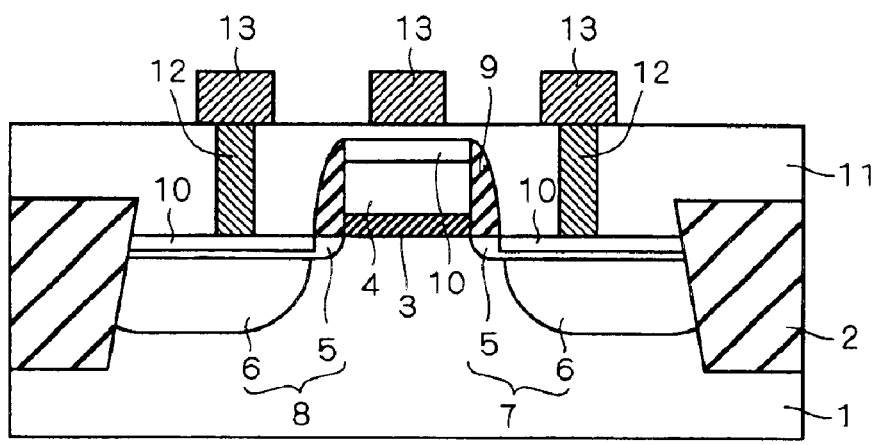
FIG. 1 is a sectional view of a structure of a MOS transistor to which the present invention is applicable.

FIG. 1 is a sectional view of a structure of the MOS transistor. A surface of a P-type silicon substrate 1 includes an active region partitioned by thick oxide films 2, in which a gate region formed of a gate oxide film 3, a polysilicon gate 4 on the gate oxide film 3 and sidewalls 9 on opposite side faces of the polysilicon gate 4 is provided. Metal silicide 10 is provided on a surface thereof of the polysilicon gate 4.

In the active region, further provided are an $N^+$-type drain region 7 and an $N^+$-type source region 8 each formed of a shallow N (or $N^+$)-type layer 5 and a deep N-type layer 6. The metal silicide 10 is formed also on respective surfaces of the $N^+$-type drain region 7 and the $N^+$-type source region 8. A portion of the shallow N-type layer 5 which protrudes from the deep N-type layer 6 functions as a source/drain extension which is an element to be desired for improving performance of a transistor having a fine structure.

A surface of the active region is provided with an insulating film 11 for protecting the active region, on which an aluminum interconnect 13 is formed. The aluminum interconnect 13 is electrically connected to the metal silicide 10 provided on the respective surfaces of the polysilicon gate 4, the $N_+$-type drain region 7 and the $N^+$-type source region 8. Moreover, tungsten plugs 12 for connecting the metal silicide 10 and the aluminum interconnect 13 via the insulating film 11 are provided.

Figure 2:
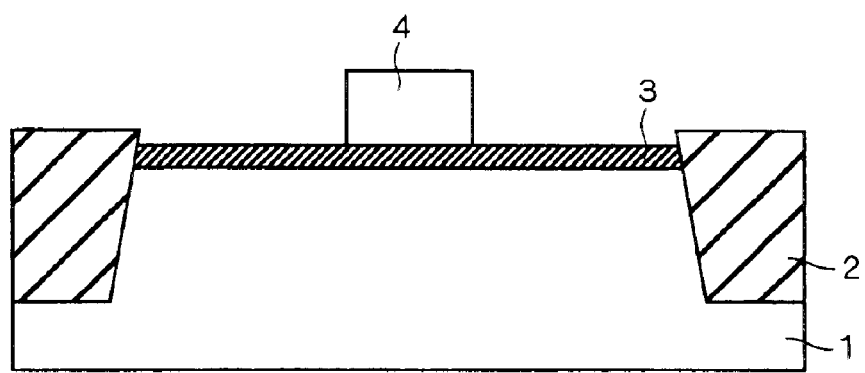

Below, procedures for manufacturing the MOS transistor illustrated in FIG. 1 will be described. FIG. 2 is a sectional view for illustrating a state in which the polysilicon gate 4 of the gate region is formed. First, the P-type silicon substrate 1 is partitioned by the oxide films 2 formed by using a trench isolation technique, for example. Subsequently, an oxidation process is carried out to form the gate oxide film 3. Further, a polysilicon film and a TEOS film or the like (not illustrated) which is to function as a hard mask are sequentially deposited. The TEOS film is patterned by photolithography, to be usable as a hard mask. Then, the polysilicon film is anisotropically etched using the hard mask, to form the polysilicon gate 4 made of the polysilicon film.

Figure 3:
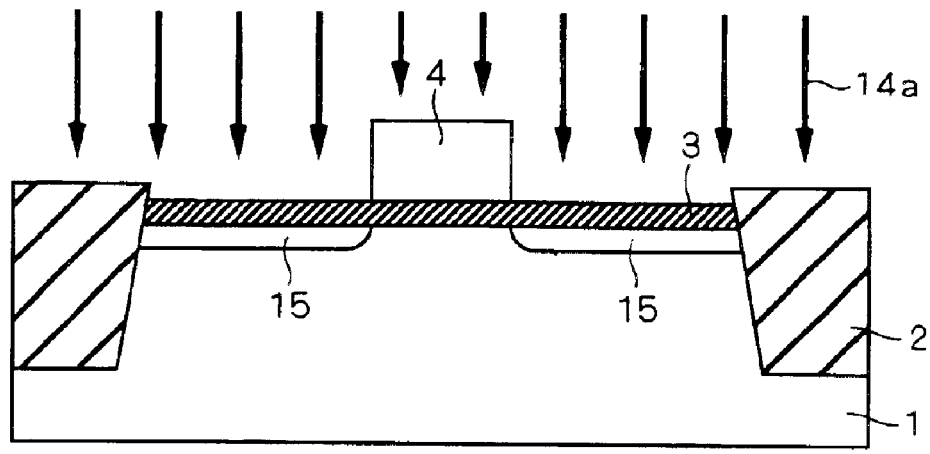

FIG. 3 is a sectional view for illustrating a state in which ion implantation to implant ions shallowly into a structure illustrated in FIG. 2 is being carried out. Ion implantation 14a at a low energy is carried out using elements serving as N-type impurities (boron, for example) on the structure illustrated in FIG. 2 from the surface of the P-type silicon substrate 1 (in which the oxide films 2 are formed). As a result, shallow N-type ion implantation layers 15 are formed in portions of the surface of P-type silicon substrate 1 on opposite sides of the polysilicon gate 4. At that time, atoms implanted into the ion implantation layers 15 are arranged in a random manner, so that crystal defects are created in the surface of the P-type silicon substrate 1. Each of the ion implantation layers 15 is kept incapable of functioning as an $N^+$-type layer (in other words, the ion implantation layers 15 are kept un-activated) at that time.

Figure 4:
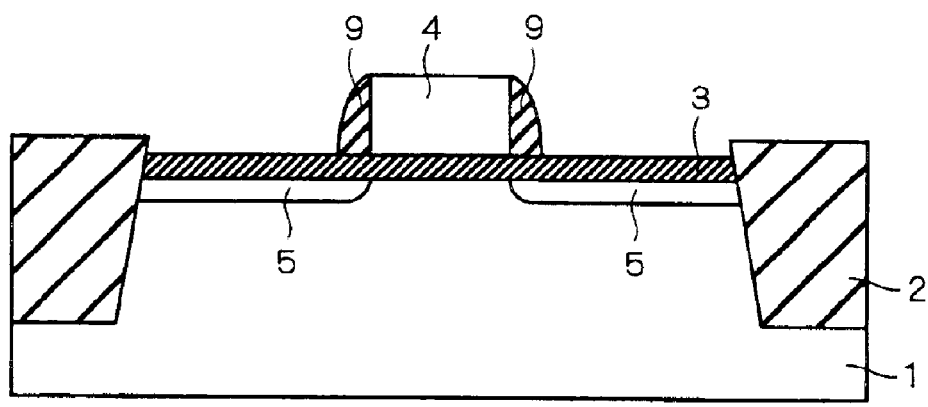

FIG. 4 is a sectional view for illustrating a state in which the shallow N-type layers 5 are formed. First, the crystal defects created by carrying out the ion implantation 14a are removed, and the implanted atoms are re-arranged to put in proper positions. As a result, the ion implantation layers 15 are activated, to form the shallow N-type layers 5. Thereafter, the sidewalls 9 are formed on the opposite side faces of the polysilicon gate 4.

Figure 5:
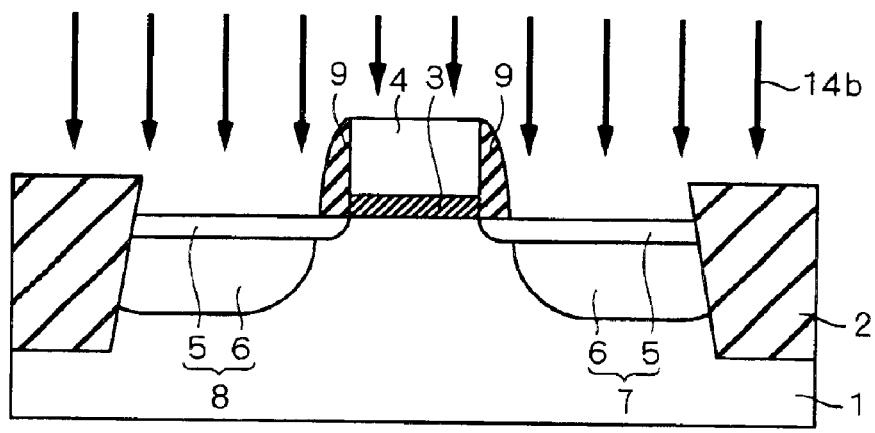

FIG. 5 is a sectional view for illustrating a state in which ion implantation to implant ions deeply into a structure illustrated in FIG. 4 is being carried out. Ion implantation 14b at a moderate energy is carried out using elements serving as N-type impurities (boron, for example) on the structure illustrated in FIG. 4 from the surface of the P-type silicon substrate 1. As a result, deep N-type ion implantation layers 16 are formed in portions of the surface of the P-type silicon substrate 1 on opposite sides of the sidewalls 9.

Figure 6:
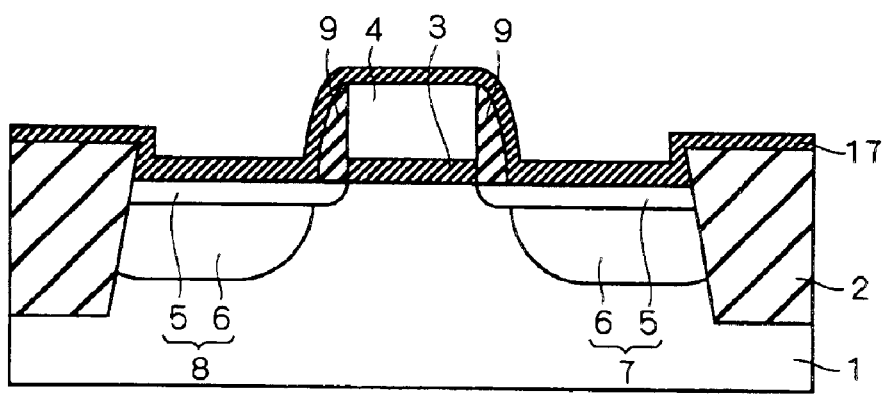

FIG. 6 is a sectional view for illustrating a state in which the deep N-type layers 6 are formed. First, the crystal defects created by carrying out the ion implantation 14b are removed, and the implanted atoms are re-arranged to put in proper positions. As a result, the ion implantation layers 16 are activated, to form the deep N-type layers 6. Thereafter, a metal layer 17 used for silicidation, which is made of cobalt, for example, is deposited entirely over a surface of a wafer, which is also illustrated in FIG. 6.

Subsequently, annealing is carried out. This causes an alloying reaction between silicon exposed in respective upper portions of the polysilicon gate 4, the $N^+$-type drain region 7 and the $N^+$-type source region 8 and portions of the metal layer 17 provided on the respective upper portions, to form the silicide 10. Thereafter, other portions of the metal layer 17 which remain un-reacted are removed by wet etching (FIG. 7). Thereafter, the insulating film 11, the tungsten plugs 12 and the aluminum interconnect 13 are formed, to complete the transistor illustrated in FIG. 1.

Now, the creation of crystal defects and the random arrangement of impurity atoms which are caused by carrying out the ion implantations 14a and 14b, and re-crystallization, will be explained. When impurity atoms are implanted into silicon, monocrystalline silicon, for example, by ion implantation, crystallinity of a part of the silicon is disrupted, so that the part is made amorphous. Meanwhile, the implanted atoms are irregularly disposed in a crystal structure of the silicon.

Figure 9:
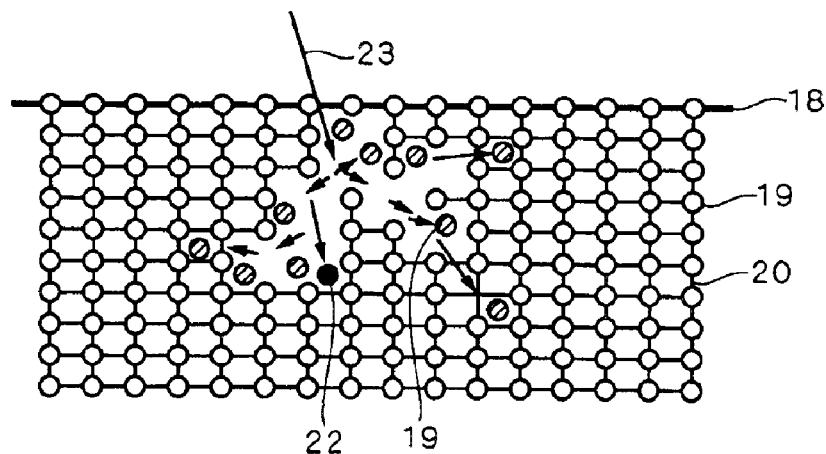

FIG. 8 diagrammatically illustrates a crystal structure of an area near a surface 18 of a silicon wafer. As illustrated, silicon atoms 19 are regularly arranged while being bonded to one another by inter-atomic bonds 20 (chemical bonds between atoms). FIG. 9 illustrates a crystal structure of the area near the surface 18 in a state in which ion implantation is being carried out. One of atoms 22 implanted from an outside collides with one of the silicon atoms 19 and scatters itself, as well as makes the one of the silicon atoms 19 a recoil atom located off its proper position of a silicon lattice, as shown by a track 23 of FIG. 9. Then, the scattered atom 22 and the recoil atom 19 collide with other ones of the silicon atoms 19, and scattered themselves, as well as make the other ones of the silicon atoms 19 recoil atoms in the same manner as noted above. Similar phenomenon repeats until the speeds of the implanted atoms 22 and the recoil atoms 19 are reduced so that the atoms 22 and 19 stop.

Figure 10:
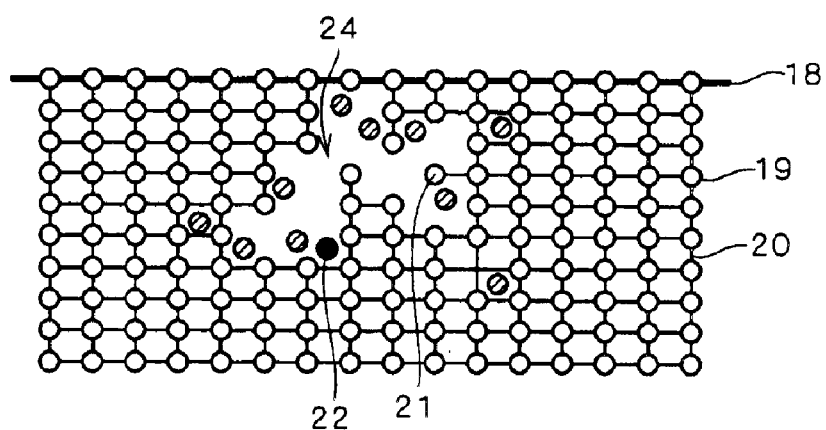

FIG. 10 illustrates a crystal structure of the area near the surface 18 in a state after ion implantation is carried out. As a result of ion implantation, most of inter-atomic bonds in the area near the surface 18 are broken, so that crystal defects 24 are created therein. In FIG. 10, each of silicon atoms with all inter-atomic bonds thereof being broken is identified by hatching. Silicon atoms 21 each with an inter-atomic bond thereof being broken and the implanted atoms 22 are disposed in the area near the surface 18 in a random manner, to present an amorphous state. In such a state where some of inter-atomic bonds in an entire crystal structure are broken, the mobility of carriers is degraded, to disable a semiconductor device. As such, there is a need of re-arranging the silicon atoms 19 and the implanted atoms 22 to be regularly disposed, while forming inter-atomic bonds. In accordance with conventional practices, re-arrangement of atoms has been achieved by a thermal treatment using irradiation of a laser light or lamp annealing.

B. Activation Process Using Thermal Treatment

Below, explanation about how a crystal defect is removed and how implanted atoms are re-arranged by a thermal treatment using irradiation of laser light or lamp annealing will be made, for the purposes of making it easier to understand advantages produced by the preferred embodiments of the present invention which will be described later.

FIG. 11 illustrates a crystal structure of the area near the surface 18 immediately after ion implantation. As a result of ion implantation, some of the inter-atomic bonds in the area near the surface 18 are broken, so that the crystal defects 24 are created at various positions. More specifically, the silicon atoms 21 each with a broken inter-atomic bond and the implanted atoms 22 exist in the area, to make the area amorphous.

FIG. 12 illustrates a crystal structure of the area near the surface 18 in a state where the area is being irradiated with a laser light having a short wavelength in a range of hundreds of nanometers to 1 $\mu$m, such as an excimer laser beam 28. A temperature of a portion of the surface 18 which is being irradiated with the excimer laser beam 28 is rising because of a thermal energy supplied from the excimer laser beam 28, and a molten portion 26 is provided therein. Both the silicon atoms 19 and the implanted atoms 22 are able to freely move around so long as they are kept molten.

As the excimer laser beam 28 moves in a direction of an arrow 29, a portion which has been passed by the excimer laser beam 28 is no longer supplied with heat (thermal energy), to rapidly solidifies itself. During the solidification, liquid phase epitaxy occurs. More specifically, the silicon atoms 19 and the implanted atoms 22 which have freely moved around are re-arranged to put in respective proper positions of a silicon lattice (when silicon is not molten), to generate a re-crystallized portion 27 in which inter-atomic bonds are formed to bond the atoms 19 and 22 to one another.

Figure 13:
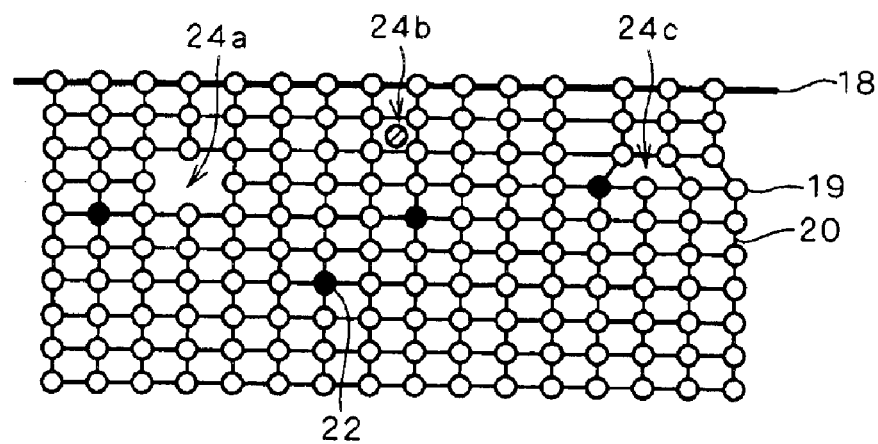

FIG. 13 illustrates a crystal structure of the area near the surface 18 after the area is irradiated with the excimer laser beam 28. Because of occurrence of liquid phase epitaxy, almost all atoms are arranged to put in respective proper positions of a silicon lattice in the area near the surface 18, to have the area substantially crystallized. However, due to rapid heating or cooling having been locally provided on the area by irradiation of the excimer laser beam 28, the area contains the crystal defects 24 such as a vacancy 24a, i.e., a lattice point which is not occupied by an atom, an interstitial atom 24b and a shift 24c in arrays of a silicon lattice, at various portions. The crystal defects 24 will affect movement of electrons and holes in a semiconductor, to degrade electrical characteristics of a semiconductor device.

To eliminate the crystal defects 24 requires a post thermal treatment. The post thermal treatment causes the implanted atoms 22 to diffuse through the silicon wafer, to invite increase in thickness of the shallow N-type layers 5 and the deep N-type layers 6.

Figure 14:
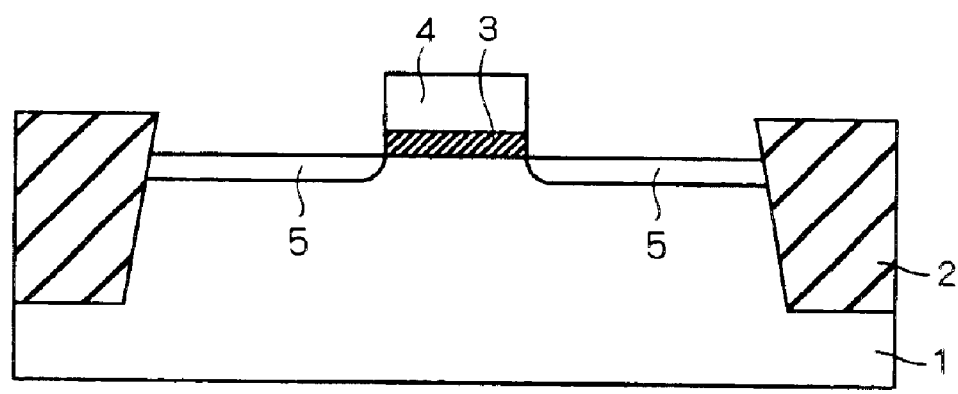
FIGS. 14 through 16 are sectional view of structures to be provided by respective steps during manufacture of a MOS transistor.

FIG. 14 is a sectional view of a structure to be provided after the ion implantation 14 at a low energy is carried out during manufacture of a MOS transistor. As illustrated therein, the shallow N-type ion implantation layers 15 are formed in portions of the surface of P-type silicon substrate 1 on opposite sides of the polysilicon gate 4.

Figure 15:
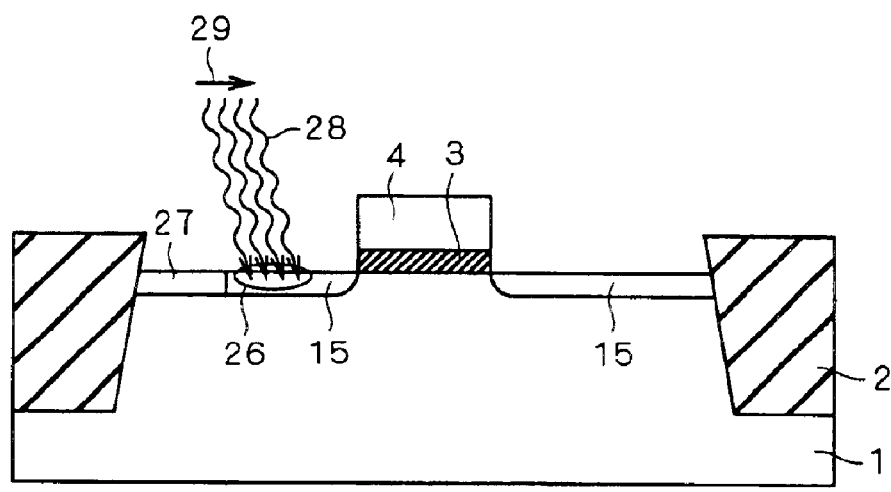

FIG. 15 is a sectional view for illustrating a state where the structure illustrated in FIG. 14 is being irradiated with the excimer laser beam 28 which moves in the direction of the arrow 29. A portion of the shallow N-type ion implantation layers 15 which is being irradiated with the excimer laser beam 28 temporarily becomes the molten portion 26, and another portion which has been passed by the excimer laser beam 28 becomes the re-crystallized portion 27.

Figure 16:
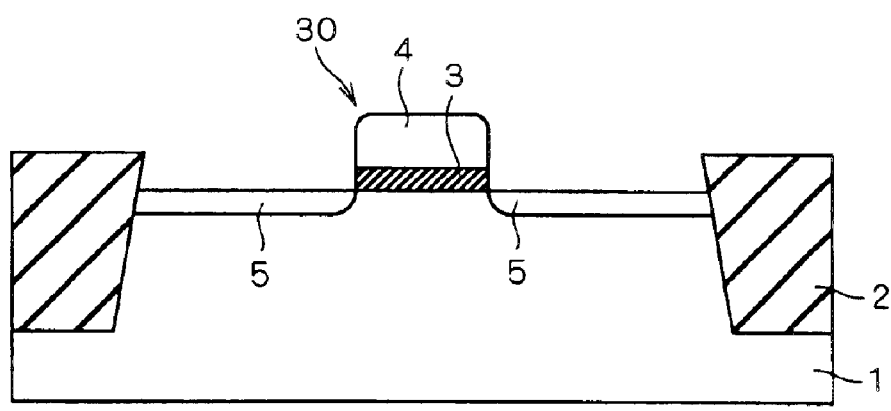

FIG. 16 is a sectional view of a structure to be provided after the structure illustrated in FIG. 14 is irradiated with the excimer laser beam 28. As the excimer laser beam 28 moves in the direction of the arrow 29 shown in FIG. 15, an entire surface of the silicon wafer including the P-type silicon substrate 1 is scanned. As a result, melting, solidification and activation are conducted to form the shallow N-type layers 5. At that time, however, also the surface of the polysilicon gate 4 is molten and solidified in the same manner, so that the surface of the polysilicon gate 4 is deformed with a corner 30 thereof being rounded, for example. Such deformation may be prevented by previously depositing a hard mask formed using a TEOS film (not illustrated), for example, on the surface of the polysilicon gate 4, which necessitates an additional step.

In an activation process, an ultraviolet light or a visible light obtained from a lamp for annealing such as halogen lamp or a xenon lamp, or a far-infrared radiation obtained by a graphite heater may alternatively be irradiated onto the surface of the silicon wafer. Irradiation of the foregoing light or radiation allows the wafer to be rapidly heated, and induces thermal vibration of silicon atoms in the wafer, thereby to cause re-crystallization, resulting in activation of implanted atoms.

Figure 17:
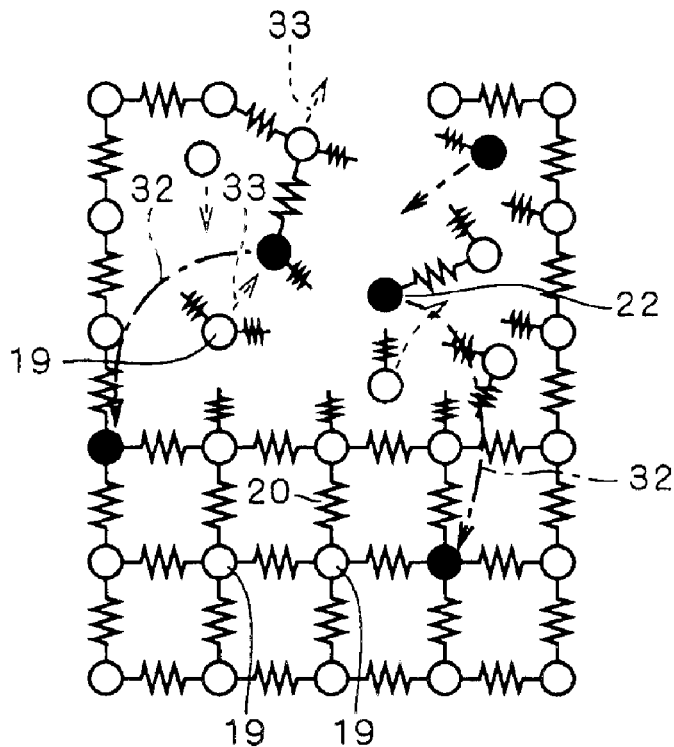
FIGS. 17 through 19 illustrate crystal structures of an area near a surface of a silicon wafer in respective states.

FIG. 17 illustrates a crystal structure of an area near a surface of a silicon wafer in a state where lamp annealing is carried out. Ones of the silicon atoms 19 which are not affected by ion implantation are bonded to one another by the inter-atomic bonds 20 with four inter-atomic bonds 20 attached to each of the silicon atoms 19. On the other hand, the implanted atoms 22 and other ones of the silicon atoms 19 which are made recoil atoms by the implanted atoms 22 move in directions of arrows 32 and 33, respectively. Each of the implanted atoms 22 and the recoil atoms 19 does not have all of four inter-atomic bonds 20 attached thereto, and exists in the silicon wafer with a broken inter-atomic bond. The atoms 19 and 22 individually vibrate upon application of heat.

The individual vibrations of the implanted atoms 22 and the recoil atoms 19 are not oriented in any particular direction. The implanted atoms 22 and the recoil atoms 19 vibrate evenly in all directions, and vibrate to a greater extent as a temperature becomes higher. When the vibrations become strong to a certain extent, solid phase epitaxy occurs. More specifically, the recoil atoms 19 and the implanted atoms 22 each of which has had a broken inter-atomic bond and has not been located in its proper position of a silicon lattice, are put in their proper positions of a silicon lattice with an inter-atomic bonds being formed.

It should be noted that the implanted atoms 22 are apt to move toward an area where the number of the atoms 22 is relatively small in thermal diffusion thereof. When ion implantation is carried out on a silicon wafer from a surface thereof, it is likely that the density of the implanted atoms 22 decreases as a distance from the surface of the silicon wafer increases, except an area very near the surface of the silicon wafer. Accordingly, the implanted atoms 22 are apt to move away from the surface.

Figure 18:
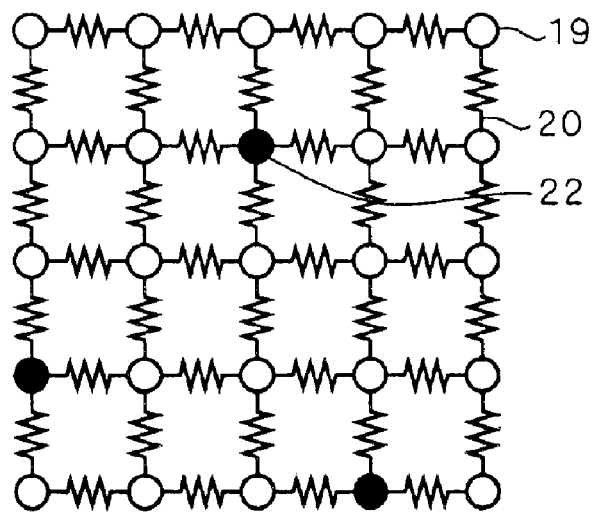

FIG. 18 illustrates a crystal structure in a state where the implanted atoms 22 have been activated by lamp annealing. After completion of lamp annealing, the atoms 22 are cooled and their vibrations become slight. Then, a re-crystallized state in which the atoms 19, 22 are arranged to put in respective almost proper positions of a silicon lattice is provided.

Figure 19:
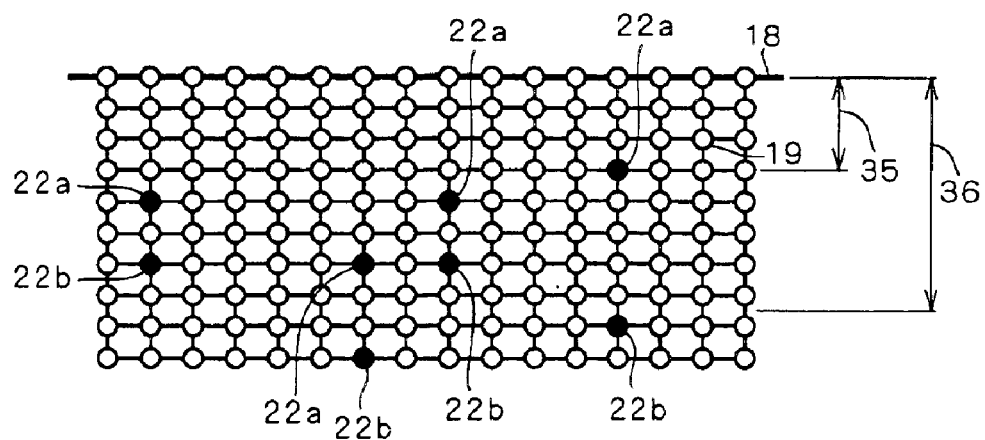

FIG. 19 shows distribution of implanted atoms to be provided after lamp annealing is carried out. When lamp annealing is employed, it is desirable to heat an entire wafer at a high temperature in order to cause solid phase epitaxy. However, this probably results in increase in a time for heating the wafer as compared with a case where irradiation of laser light is employed. Because of a relatively long heating time, the atoms 22 implanted into the wafer from the surface 18 move from positions 22a of the atoms 22 before a thermal treatment (lamp annealing) to positions 22b. Accordingly, the thickness of a silicon layer containing impurities increases from a thickness 35 before lamp annealing to a thickness 36. Where the MOS transistor is concerned, it turns out to be ineffective to form the shallow N-type ion implantation layers 15 (FIG. 3) for forming the shallow N-type layers 5 (please refer to FIG. 1), because the implanted atoms 22 are kept at a temperature which is high enough to cause thermal diffusion of the atoms 22, for a relatively long time. After all, the thicknesses of the shallow N-type layers 5 unnecessarily increase.

Figure 20:
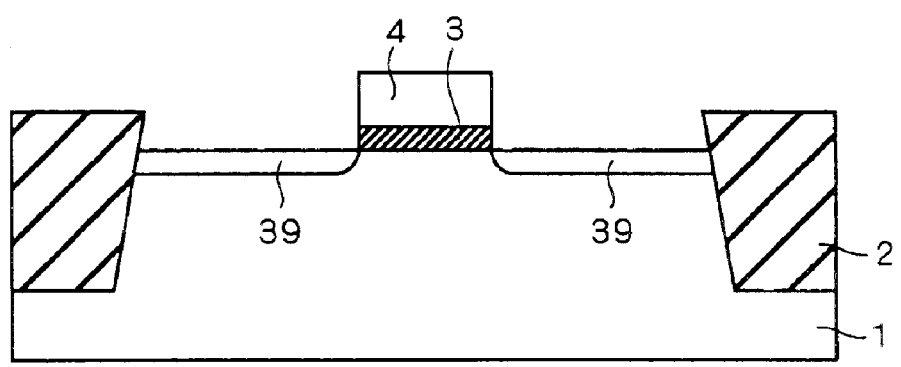
FIGS. 20 through 22 are sectional view of structures to be provided by respective steps during manufacture of a MOS transistor.

FIG. 20 is a sectional view of a structure in a state after the ion implantation 14a at a low energy is carried out during manufacture of a MOS transistor.

Figure 21:
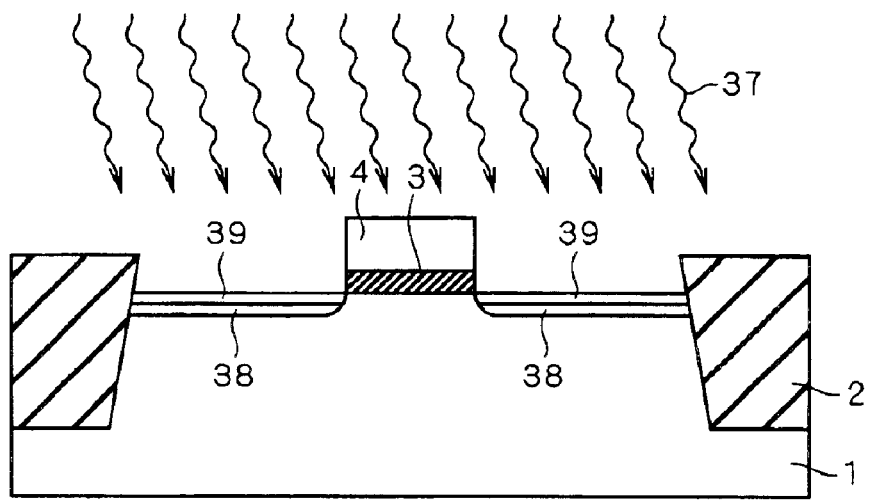

FIG. 21 is a sectional view for illustrating a state where lamp annealing is being carried out on the structure illustrated in FIG. 20. Heat 37 supplied by a lamp causes an amorphous portion to be re-crystallized sequentially from an interface between the amorphous portion and a crystalline portion. As a result, ions diffuse beyond portions 39 in which ions are initially implanted, to form ion-diffusing portions 38 which are deeper than the portions 39.

Figure 22:
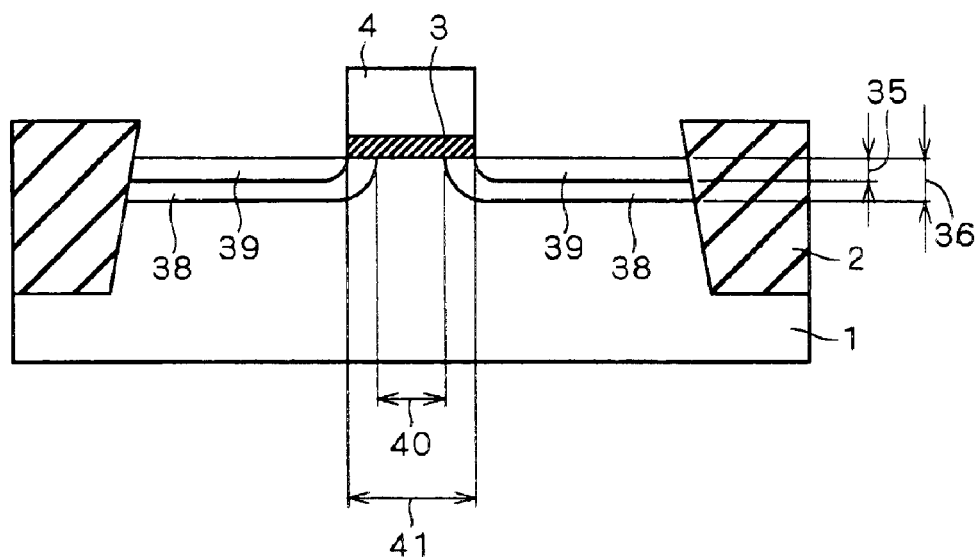

FIG. 22 is a sectional view of a structure to be provided after lamp annealing is carried out. The thickness 36 of the silicon layer containing impurities which has been activated by lamp annealing is larger than the thickness 35 of the silicon layer containing impurities before lamp annealing, in other words, at the time of ion implantation, because of diffusion of the implanted atoms during lamp annealing. Also, as the implanted atoms diffuse not only in a vertical direction but also in a horizontal direction, a channel length 41 to be provided after lamp annealing is smaller than a channel length 40 to be provided at the time of ion implantation. Such dimensional changes would affect an operation of a transistor to a greater extent as the transistor is further miniaturized.

C. First Preferred Embodiment

A first preferred embodiment will describe a method of manufacturing a semiconductor device, which includes an impurity introduction process and an activation process. In the activation process of the method according to the first preferred embodiment, a coherent light is irradiated onto a semiconductor into which impurities have been introduced by the impurity introduction process. The coherent light has a wavelength at which multi-phonon lattice absorption of the semiconductor occurs. Occurrence of multi-phonon lattice absorption can function to decrease crystal defects created in the semiconductor during the impurity introduction process.

The semiconductor, which is originally not infrared active, becomes to be able to absorb an infrared light upon occurrence of multi-phonon lattice absorption. For this reason, an infrared light is employed as a coherent light. The semiconductor in which multi-phonon lattice absorption can be observed in an infrared spectroscopy procedure has a non-polar crystal. For example, when the semiconductor has a crystal structure, the crystal structure includes a covalent bond, to present a diamond structure, for example. In such a case, absorption of two phonons (hereinafter, referred to as "two-phonon absorption") of an optical phonon and an acoustic phonon can be observed as multi-phonon lattice absorption. As an example of a semiconductor in which each of an optical phonon and an acoustic phonon, both of which contribute to two-phonon absorption, provides a transverse vibration mode, silicon and germanium are cited.

Figure 23:
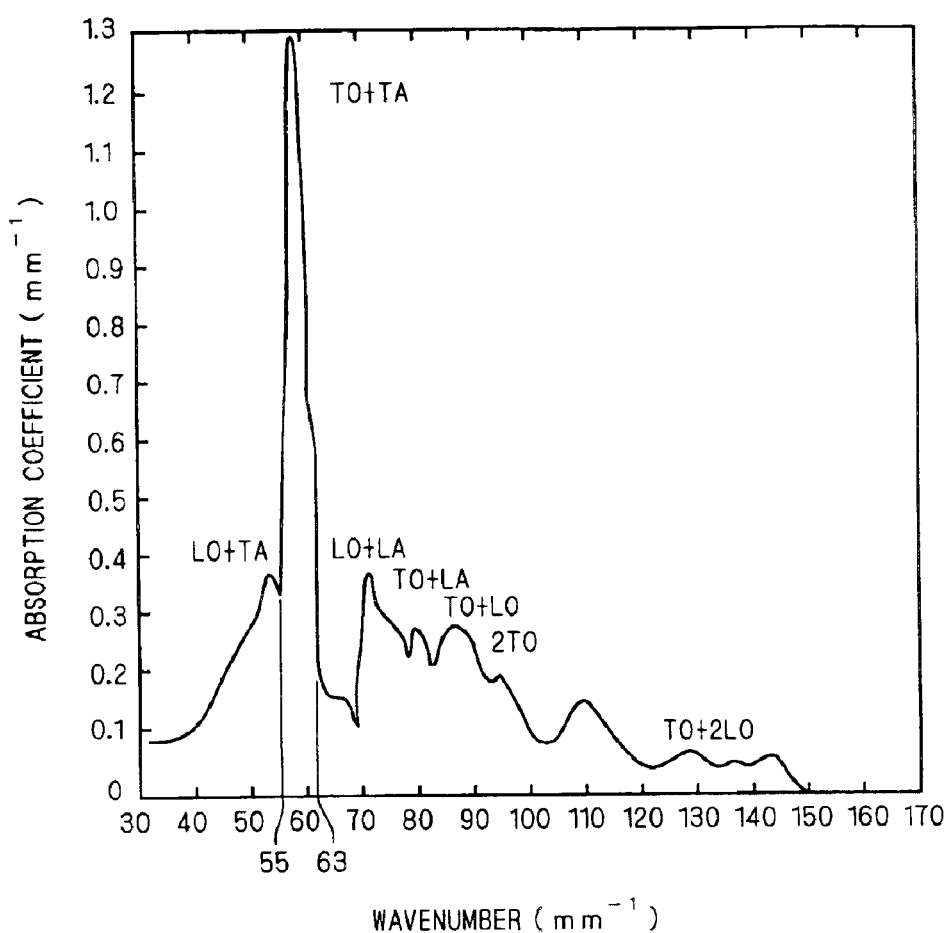
FIG. 23 is a graph showing a relationship between a wavenumber of a light and an absorption coefficient.

FIG. 23 is a graph showing a relationship between a wavenumber of a light irradiated onto silicon and an absorption coefficient. A plurality of peaks are present in the graph, each of which occurs when the wavenumber takes a value at which multi-phonon lattice absorption occurs. Characters TO, LO, TA and LA indicate an optical phonon in a transverse vibration mode, an optical phonon in a longitudinal vibration mode, an acoustic phonon in a transverse vibration mode and an acoustic phonon in a longitudinal vibration mode, respectively. One of the peaks with an extremely high absorption coefficient indicates occurrence of two-phonon absorption of the optical phonon in a transverse vibration mode and the acoustic phonon in a transverse vibration mode. As shown, an absorption coefficient is significantly increased when the wavenumber falls within a range of 55 to 63 nm$^{-1}$. The wavenumber in the range of 55 to 63 nm$^{-1}$ corresponds to a wavelength in a range of 16 to 17 $\mu$m.

As is made clear from the foregoing, silicon can absorb extremely easily a light having a wavelength in a range of 16 to 17 $\mu$m, and phonon absorption of silicon is possible. Below, an activation process employing phonon absorption will be described.

Figure 24:
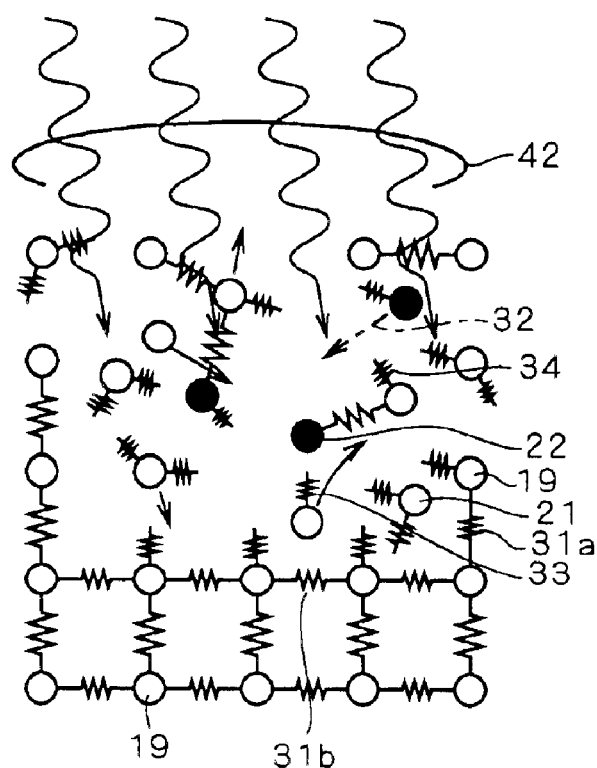
FIG. 24 illustrates a method of manufacturing a semiconductor device according to a first preferred embodiment of the present invention.

FIG. 24 illustrates the method of manufacturing a semiconductor device according to the first preferred embodiment. In an area near a surface of silicon on which an impurity introduction process has been performed, bonds for a crystal structure of the silicon are broken due to ion implantation. Thus, an amorphous portion in which the silicon atoms 21 each with a broken bond 34 and the implanted atoms 22 co-reside is obtained as an impurity layer. On the other hand, in a portion under the impurity layer (i.e., in a portion which is located opposite to a portion from which ion implantation is carried out, with the amorphous portion in between), the silicon atoms 19 are arranged to put in respective proper positions of a silicon lattice.

Irradiation of a coherent light having a wavelength in a range of 16 to 17 $\mu$m such as a pulsed laser beam 42 including short pulses in a range of several femtoseconds to several nanoseconds onto the portion of the silicon under the impurity layer causes multi-phonon lattice absorption. In particular, a crystal lattice of the portion vibrates in resonance of the coherent light, so that great lattice vibration occurs locally in the silicon. It is noted that a bond 31 a at a location where the great lattice vibration occurs is diagrammatically expressed by including a zigzag having an amplitude larger than that of a zigzag included in another bond 31b at a location where the great lattice vibration does not occur, in FIG. 24.

As a result of the great lattice vibration, some of the silicon atoms 21 and the implanted atoms 22 each of which is disposed near a location where the great lattice vibration occurs and has the broken bond 34, are vibrating, as well as bonded to the silicon atoms 19 arranged to put in respective proper positions of a silicon lattice in the portion under the impurity layer. As a result, re-arrangement of the silicon atoms 19 (solid phase epitaxy) occurs.

When the laser beam 42 has a sufficiently high intensity and each pulse is sufficiently long or the number of pulses is sufficiently large, bonds between the silicon atoms 19 are formed to re-crystallize the amorphous portion. Re-crystallization occurs only in a portion which is irradiated with the laser beam 42 because solid phase epitaxy in the irradiated portion has finished before an energy supplied from the laser beam 42 diffuses into a periphery of the irradiated portion. Re-crystallization does not occur in a portion which is not irradiated with the laser beam 42. Accordingly, by scanning a surface of a wafer using the laser beam 42 while narrowing an area to be irradiated with the laser beam 42, only a portion which is irradiated with the laser beam 42 is re-crystallized.

The foregoing procedures according to the first preferred embodiment provides for reduction in an amount of heat to be absorbed as compared with the conventional lamp annealing, to prevent excessive absorption of heat. Further, the procedures according to the first preferred embodiment do not involve a local phase change such as melting or solidification which is inevitably involved in one of the conventional techniques using melting and solidification which are caused by employing irradiation of a short-wavelength laser beam. Accordingly, defects in a commensurate lattice are dramatically improved. As a result, thermal diffusion of the implanted atoms 22 is prevented, so that distribution of the implanted atoms 22 in both directions of a depth and a width to be provided immediately after ion implantation is substantially identical to that to be provided immediately after re-crystallization.

Figure 25:
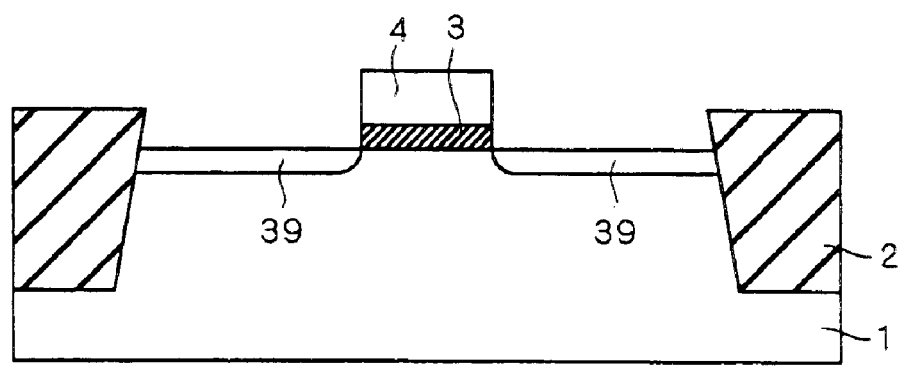
FIGS. 25 through 27 are sectional view for illustrating procedures for manufacturing the MOS transistor.
Figure 26:
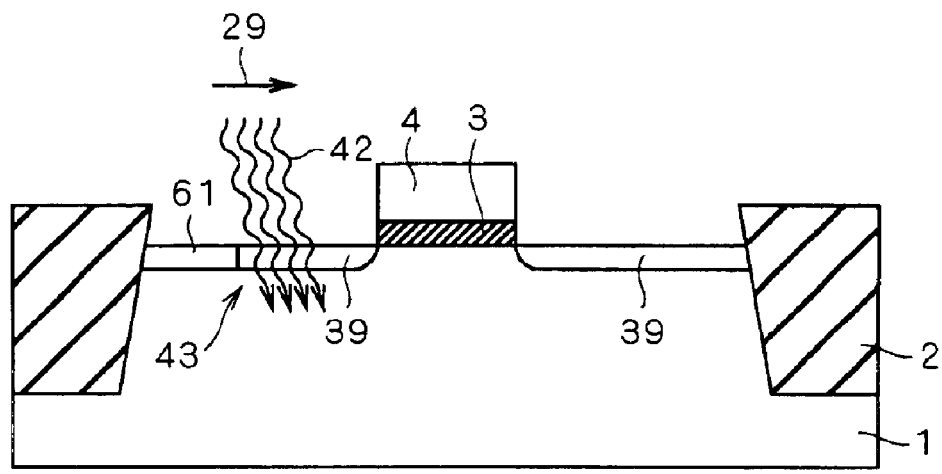
Figure 27:
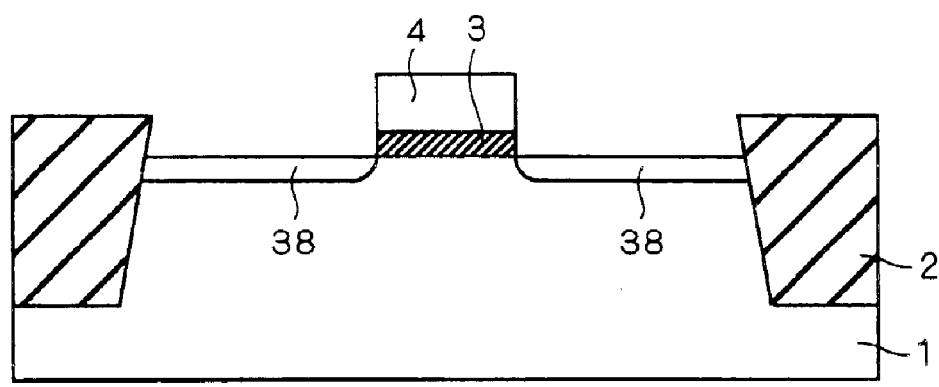

Next, procedures for forming a pn junction utilizing the foregoing activation process will be described. In brief, a semiconductor to which a P- or N-conductivity type has previously been imparted by introduction of impurities is prepared, then impurities which impart an N- or P-conductivity type to the semiconductor are introduced into the semiconductor in an impurity introduction process, and thereafter the activation process utilizing phonon absorption is carried out. FIGS. 25 through 27 are sectional views for illustrating formation of a drain region and a source region of a MOS transistor in order of occurrence of respective steps.

FIG. 25 is a sectional view of a structure in a state where the ion implantation 14a at a low energy is carried out during manufacture of the MOS transistor. FIG. 26 is a sectional view of the structure illustrated in FIG. 21 in a state where the laser beam 42 having a wavelength in a range of 16 to 17 $\mu$m is being irradiated thereonto. The laser beam 42 moves in the direction of the arrow 29. In a portion 43 which is being irradiated with the laser beam 42, bonds between atoms are being formed so that the atoms are being arranged to put in respective proper positions of a silicon lattice. Further, a portion 61 which is included in the portions 39 having ions implanted thereinto and has been irradiated with the laser beam 42 is activated and re-crystallized. As stated above, since distribution of the implanted atoms 22 in both directions of a depth and a width to be provided immediately after ion implantation is substantially identical to that to be provided immediately after re-crystallization, the size of a source/drain extension hardly varies, to facilitate formation of a pn junction at a desired position. Thus, the first preferred embodiment will greatly contribute to miniaturization of a transistor.

Additionally, irradiation of the laser beam 42 exhibits its effects of causing atoms to be arranged to put in respective proper positions of a silicon lattice not only in the portions 39, but also in an area near the portion 43 which is irradiated with the laser beam 42 in the P-type silicon substrate 1.

Lamp annealing allows only atoms arranged to put in respective proper positions of a silicon lattice under an amorphous portion to epitaxially grow as species for solid phase epitaxy. In contrast, irradiation of a coherent light which causes multi-phonon lattice absorption according to the first preferred embodiment allows not only atoms arranged to put in respective proper positions of a silicon lattice under an amorphous portion, but also the portion 61 which is re-crystallized by irradiation of a laser beam, to epitaxially grow as species for solid phase epitaxy. Accordingly, it is possible to reduce an energy of lattice vibration, to further suppress thermal diffusion of the implanted atoms 22.

Further, crystallization may not necessarily be accomplished at once, and can alternatively be accomplished through a plurality of stages, by reducing the intensity of the laser beam 42 or increasing a scanning speed. This results in reduction in an energy of lattice vibration. The foregoing treatments also provides for further suppression of thermal diffusion of the implanted atoms 22.

When putting the present invention into practice, a silicon wafer may be heated at a temperature of approximately 400° C., for example, at which thermal diffusion is negligible. This increases the extent of lattice vibration as well as the absorption coefficient associated with the laser beam 42, to make it possible to attain the above-noted effects while reducing a power of the laser beam.

As described above, according to the first preferred embodiment, it is possible to prevent thermal diffusion of implanted atoms provided by ion implantation and to activate the implanted atoms while keeping distribution of the implanted atoms in both directions of a depth and a width substantially constant. This makes it possible to obtain a semiconductor device which includes a shallow junction having a distribution profile with a depth identical to a depth of ion implantation. Further, activation can be achieved without rapidly melting or solidifying a surface of silicon, which makes it possible to suppress creation of crystal defects which are likely to be created due to rapid local solidification, as well as to prevent deformation of a surface of a polysilicon gate which is likely to occur due to melting.

Additionally, irradiation of a laser beam having a wavelength at which phonon absorption of silicon occurs results in not only formation of a pn junction, but also repair of mis-bond or lattice mismatch in an interface between crystalline silicon and a silicon oxide film, or between metal and silicon.

D. Second Preferred Embodiment

Figure 28:
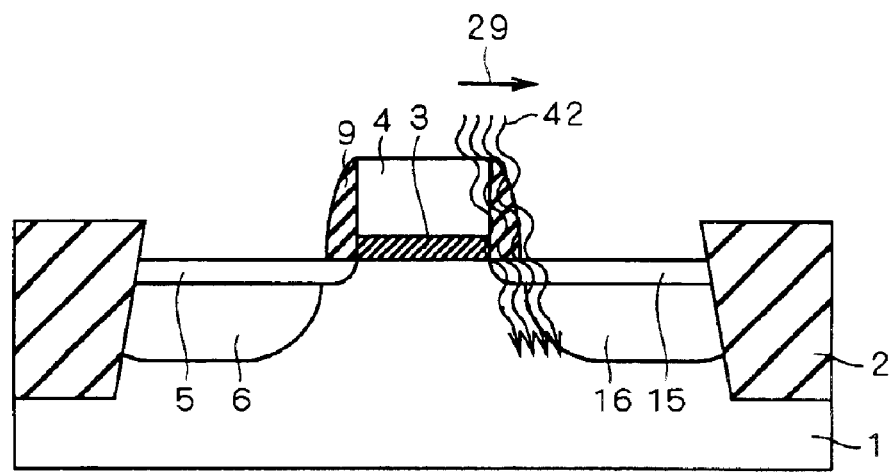
FIG. 28 is a sectional view for illustrating a method of manufacturing a semiconductor device according to a second preferred embodiment of the present invention.

FIG. 28 is a sectional view for illustrating a method of manufacturing a semiconductor device according to a second preferred embodiment. FIG. 28 illustrates a structure in a state where the polysilicon gate 4 has been formed, the ion implantation 14a at a low energy has been carried out, the sidewalls 9 have been formed, and the ion implantation 14b at a moderate energy has been carried out, so that the shallow N-type ion implantation layers 15 and the deep N-type ion implantation layers 16 have been formed. According to the second preferred embodiment, both the shallow N-type ion implantation layers 15 and the deep N-type ion implantation layers 16 are activated by irradiation of the laser beam 42. More specifically, first, impurities are introduced into a silicon layer to a first depth, and impurities are further introduced into the silicon layer to a second depth different from the first depth. Subsequently, the laser beam 42 is irradiated onto all the impurities introduced into the silicon layer to the first and second depths. In portions of the silicon layer which are irradiated with the laser beam 42, the shallow N-type layers 5 and the deep N-type layers 6 are provided.

According to the conventional technique for activation employing irradiation of the excimer laser beam 28 (please refer to FIG. 15), a silicon oxide film absorbs the excimer laser beam 28 in a large amount. For this reason, irradiation of the excimer laser beam 28 for activating the shallow ion implantation layers 15 must be performed prior to formation of the sidewalls 9. On the other hand, according to the conventional technique for activation employing lamp annealing, there is a need to heat entirely an wafer, which makes it difficult to prevent thermal diffusion of implanted atoms in activating the deep ion implantation layers 16 by utilizing solid phase epitaxy.

In contrast, the laser beam 42 capable of causing phonon absorption transmits through a silicon oxide film and silicon at a higher transmittance than the excimer laser beam 28 so that it is absorbed by an entire inside of a silicon wafer to be resonant with lattice vibration. Accordingly, it is possible to form a pn junction in any desired portion in a silicon wafer while attaining the same advantages as produced in the first preferred embodiment, to manufacture a semiconductor device.

According to the second preferred embodiment, impurities which are introduced into a semiconductor by performing an impurity introduction process twice can be activated parallelly. This allows for not only simplification of associated processes, but also prevention of occurrence of a situation where impurity atoms which have been activated in the shallow N-type layers 5 diffuse during activation of the deep ion implantation layers 16.

E. Third Preferred Embodiment

Figure 29:
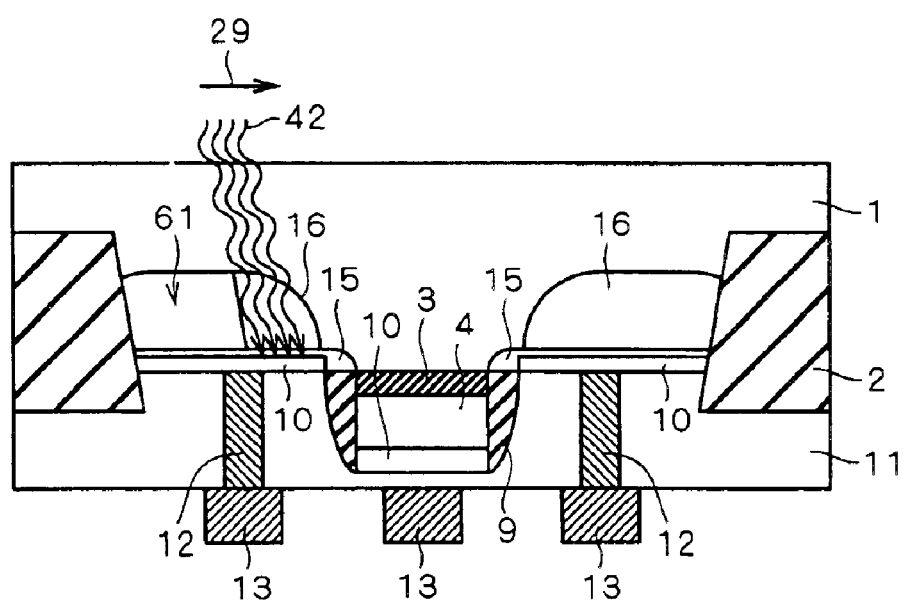
FIG. 29 is a sectional view for illustrating a method of manufacturing a semiconductor device according to a third preferred embodiment of the present invention.

FIG. 29 is a sectional view for illustrating a method of manufacturing a semiconductor device according to a third preferred embodiment. A structure illustrated in FIG. 29 is substantially identical to that illustrated in FIG. 1 except that the shallow N-type ion implantation layers 15 and the deep N-type ion implantation layers 16 are provided in place of the shallow N-type layers 5 and the deep N-type layers 6, respectively. The structure illustrated in FIG. 29 is resulted from forming the sidewalls 9, the metal silicide 10, the insulating film 11, the tungsten plugs 12 and the aluminum interconnect 13 prior to activating the shallow N-type ion implantation layers 15 and the deep N-type ion implantation layers 16.

The structure of FIG. 29 is illustrated such that a back face of the P-type silicon substrate 1 which is opposite to a face of the P-type silicon substrate 1 from which ion implantation is carried out (i.e., a face opposite to a face in which the polysilicon gate 4 is provided on the P-type silicon substrate 1) appears up in the drawing.

As described above, the laser beam 42 capable of causing phonon absorption is absorbed by an entire inside of a silicon wafer to be resonant with lattice vibration. This allows irradiation of the laser beam 42 to be carried out on the P-type silicon substrate 1 from the back face thereof. As a result of irradiation of the laser beam 42, atoms included in the shallow N-type ion implantation layers 15 and the deep ion implantation layers 16 are re-arranged. As the laser beam 42 moves in the direction of the arrow 29, activation and re-crystallization of the portion 61 which has been irradiated with the laser beam 42 in the shallow N-type ion implantation layers 15 and the deep ion implantation layers 16 proceed.

Thus, the third preferred embodiment produces the same advantages as produced in the second preferred embodiment. Specifically, the third preferred embodiment provides for simplification of associated processes and prevention of diffusion of impurity atoms included in the shallow N-type layers 5.

Figure 30:
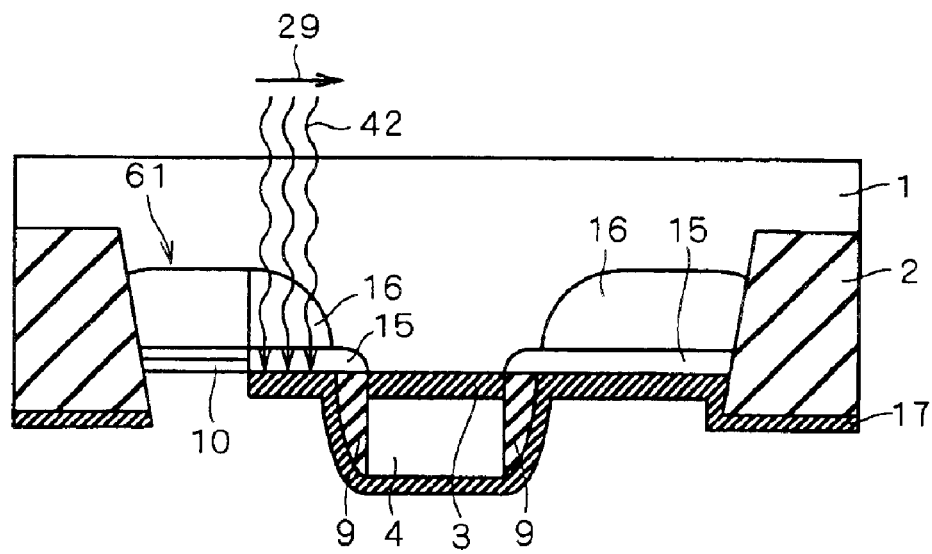
FIG. 30 is a sectional view for illustrating a method of manufacturing a semiconductor device according to a modification of the third preferred embodiment of the present invention.

FIG. 30 is a sectional view for illustrating a modification of the third preferred embodiment. A structure illustrated in FIG. 30 is substantially identical to that illustrated in FIG. 6, except that the shallow N-type ion implantation layers 15 and the deep N-type ion implantation layers 16 are provided in place of the shallow N-type layers 5 and the deep N-type layers 6, respectively. The structure illustrated in FIG. 30 is resulted from forming the sidewalls 9 and the metal layer 17 used for silicidation prior to activating the shallow N-type ion implantation layers 15 and the deep N-type ion implantation layers 16.

In this modification, irradiation of the laser beam 42 is carried out on the structure illustrated in FIG. 30 from the back face of the P-type silicon substrate 1. As a result, not only activation and re-crystallization of the shallow N-type ion implantation layers 15 and the deep N-type ion implantation layers 16, but also silicidation of an interface between the metal layer 17 and each of the shallow N-type ion implantation layers 15 can be accomplished. This contributes to simplification of entire manufacture of a transistor.

F. Fourth Preferred Embodiment

Figure 31:
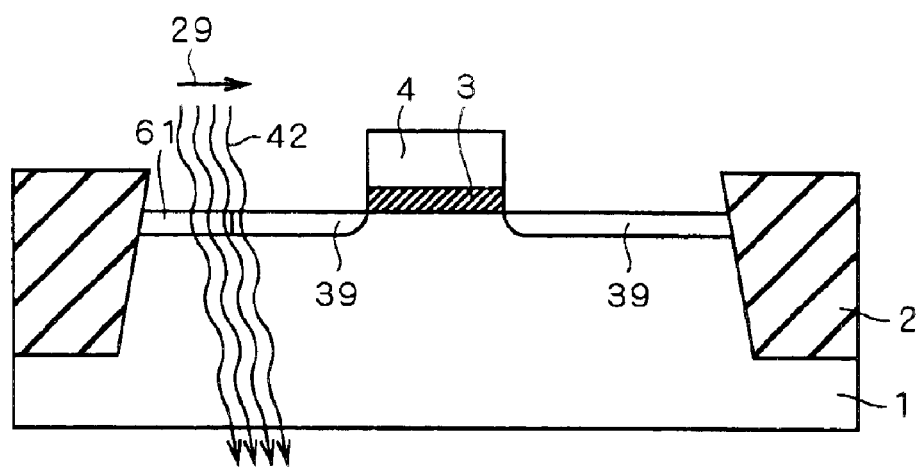
FIG. 31 is a sectional view for illustrating a state in which a laser beam is transmitting through silicon.

As described in the second and third preferred embodiments, a light capable of causing phonon absorption transmits through silicon at a high transmittance. For example, a light with a wavelength of approximately 16.3 μm transmits through a silicon wafer with a thickness of approximately 500 μm at a transmittance of approximately 30%. FIG. 31, which is prepared based on FIG. 26, is a sectional view for illustrating how the laser beam 42 transmits through the P-type silicon substrate 1.

In view of the above noted transmittance characteristics, the fourth preferred embodiment provides for effective use of a laser light to be irradiated. Specifically, according to the fourth preferred embodiment, a laser light which has transmitted through a silicon wafer is caused to be incident again upon the silicon wafer by reflecting the light, for example. As an alternative to reflection, refraction may be employed to cause a laser light to be incident again upon a silicon wafer. A laser light which is initially incident upon a silicon wafer and a laser light which is later incident upon the silicon wafer interfere with each other, to intensify each other.

Figure 32:
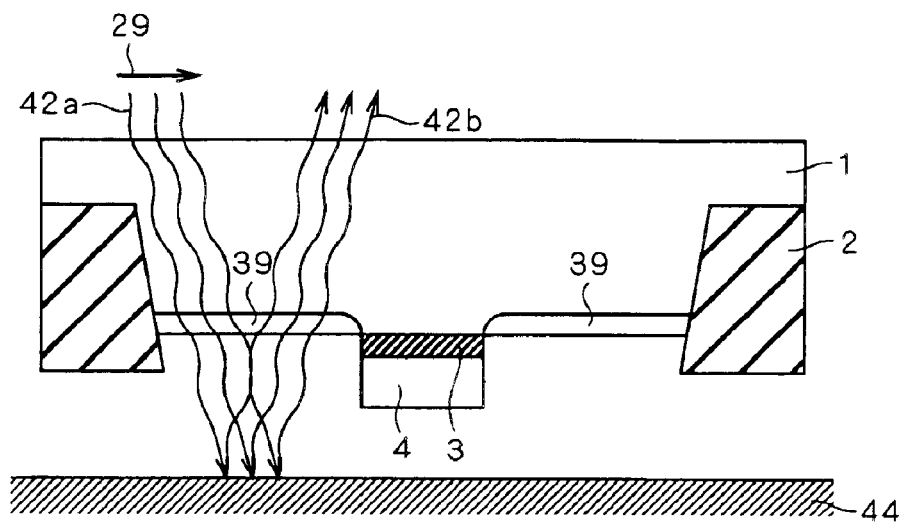
FIG. 32 is a sectional view for illustrating a method of manufacturing a semiconductor device according to a fourth preferred embodiment of the present invention.

FIG. 32 is a sectional view for illustrating a method of manufacturing a semiconductor device according to the fourth preferred embodiment. The portions 39 into which ions are implanted are equivalent to the shallow N-type ion implantation layers 15, for example. A reflective mirror 44 for reflecting a laser beam is disposed adjacent to a face of the P-type silicon substrate 1 in which the portions 39 are provided. A laser beam 42a capable of causing phonon absorption is incident upon the back face of the P-type silicon substrate 1, and transmits in part through the P-type silicon substrate 1 while causing phonon absorption of the P-type silicon substrate 1. The transmitted light is reflected by the reflective mirror 44, to generate a laser beam 42b which is incident upon the P-type silicon substrate 1 from the face in which the portions 39 are provided. As a result, the laser beams 42a and 42b interfere with each other in the vicinity of the portions 39.

By appropriately positioning the reflective mirror 44, it is possible to allow the laser beams 42a and 42b to interfere with each other so as to intensify each other, to provide for increase in efficiency in activating and re-crystallizing the portions 39. For example, 90% or more of a power of the laser beam 42a can be utilized with the minimum wastage. Alternatively, the reflective mirror 44 may be disposed adjacent to the back face of the P-type silicon substrate 1 so that the laser beam 42a be incident upon the P-type silicon substrate 1 from the face in which the portions 39 are provided, of course, if such position of the reflective mirror 44 allows the laser beams 42a and 42b to interfere with each other so as to intensify each other in the vicinity of the portions 39.

Figure 33:
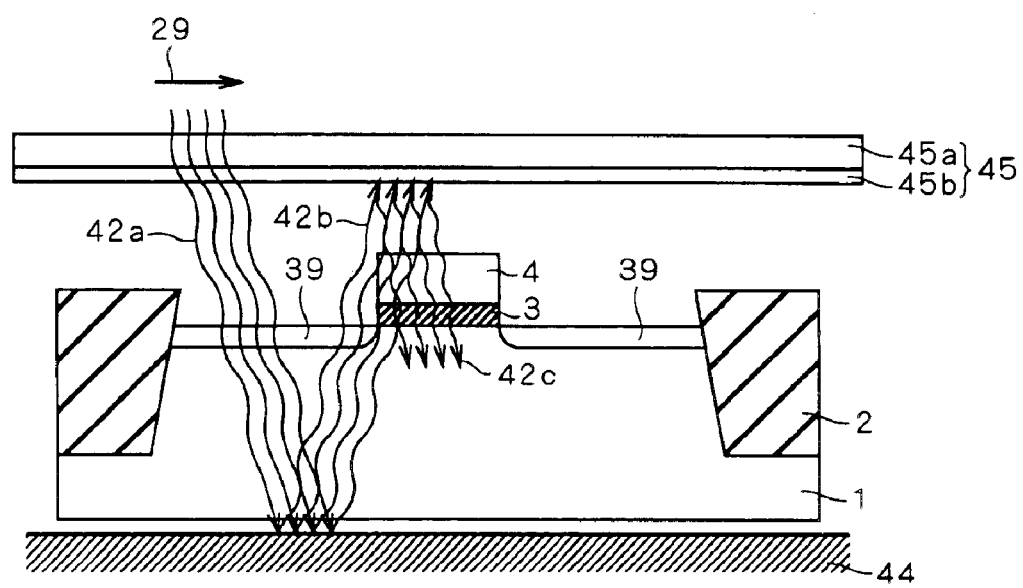
FIG. 33 is a sectional view for illustrating a method of manufacturing a semiconductor device according to a modification of the fourth preferred embodiment of the present invention.

FIG. 33 is a sectional view for illustrating a modification of the fourth preferred embodiment. The laser beam 42a is incident upon the P-type silicon substrate 1 from the face in which the portions 39 are provided, and the reflective mirror 44 is disposed adjacent to the back face of the P-type silicon substrate 1. Further, a half mirror 45 is provided for reflecting the laser beam 42b, adjacent to the face of the P-type silicon substrate 1 in which the portions 39 are provided.

The half mirror 45 includes a transparent substrate 45a which allows a laser light to transmit therethrough and a reflective film 45b which reflects a laser light. The half mirror 45 is disposed such that the reflective film 45b is located closer to the P-type silicon substrate 1 than the transparent substrate 45a. Accordingly, the laser beam 42a is irradiated onto the P-type silicon substrate 1, having transmitted through the transparent substrate 45a and the reflective film 45b. The laser beam 42a causes phonon absorption of the P-type silicon substrate 1 and is reflected by the reflective mirror 44, to generate the laser beam 42b which is to be incident upon the P-type silicon substrate 1, in the same manner as described above. In accordance with this modification, the laser beam 42b is reflected by the reflective film 45b to generate a laser beam 42c, which is incident upon the P-type silicon substrate 1 from the face in which the portions 39 are provided. The laser beam 42c functions in the same manner as the laser beam 42a.

The reflective mirror 44 and the half mirror 45 can be disposed so as to prevent the laser beams 42a, 42b and 42c from interfering with one another so as to attenuate one another in the silicon wafer including the P-type silicon substrate 1. As a result, it is possible to utilize approximately 100% of a power of the laser beam 42a.

The fourth preferred embodiment allows re-use of a transmitted light even in a situation where a silicon wafer is thin and a laser light to be irradiated transmits through the silicon wafer at a high transmittance. Accordingly, it is possible to effectively use most of a power of a laser light to be irradiated, which reduces a power required of a laser light. This reduces costs associated with manufacture of an apparatus for irradiating a laser light, as well as running costs.

G. Fifth Preferred Embodiment

In the configuration according to the fourth preferred embodiment, the laser beams 42a and 42b may possibly interfere with each other so as to attenuate each other in the P-type silicon substrate 1 depending on a position of the reflective mirror 44. Such a situation can be avoided by causing the laser beam 42a having transmitted through the P-type silicon substrate 1 to scatter by using a holder of the silicon wafer, to prevent the laser beam 42b from being incident upon the P-type silicon substrate 1. Alternatively, the holder of the silicon wafer may be formed so as to absorb a laser beam.

FIG. 34 is a sectional view for illustrating a first example of a method of manufacturing a semiconductor device according to the fifth preferred embodiment. The P-type silicon substrate 1 including the portions 39 into which ions are implanted is mounted on a holder 46. It is noted that though FIG. 34 illustrates a situation in which the back face of the P-type silicon substrate 1 is in contact with the holder 46, the P-type silicon substrate 1 may alternatively be upside down so that the polysilicon gate 4 is mounted directly on the holder 46.

The laser beam 42a is irradiated onto the P-type silicon substrate 1 from the face opposite to the back face which is in contact with the holder 46. The laser beam 42a transmits through the P-type silicon substrate 1 to reach the holder 46, while causing phonon absorption of the P-type silicon substrate 1. At least a face of the holder 46 which directly mounts the P-type silicon substrate 1 has a property capable of scattering a laser light. Accordingly, the laser beam 42b obtained by having the laser beam 42a reflected by the holder 46 is scattered. Hence, there is the slightest possibility that interference between the laser beams 42a and 42b is caused in the P-type silicon substrate 1, thereby to reduce a possibility that the laser beams 42a and 42b interfere with each other so as to attenuate each other.

FIG. 35 is a sectional view for illustrating a second example of the method of manufacturing a semiconductor device according to the fifth preferred embodiment. FIG. 35 illustrates a structure which is identical to that illustrated in FIG. 34 except that a holder 47 is disposed in place of the holder 46. It is noted that though FIG. 35 illustrates a situation in which the back face of the P-type silicon substrate 1 is in contact with the holder 47, the P-type silicon substrate 1 may alternatively be upside down so that the polysilicon gate 4 is mounted directly on the holder 47.

The holder 47 is made of a material which absorbs a laser beam without reflecting it. Silicon can be employed as the foregoing material for the holder 47, for example. The holder 47 does not reflect the laser beam 42a so that the laser beam 42b is not generated (please refer to FIGS. 32 through 34). Accordingly, the laser beam 42a is not attenuated due to interference.

As descried above, the fifth preferred embodiment makes it possible to suppress attenuation of a laser light, which may occur when the laser light transmitting through a silicon wafer interferes with a reflected laser light which is produced by reflecting the laser light and is incident upon the silicon wafer, even if the silicon wafer is so thin that the laser light can transmit therethrough. Hence, it is possible to predict a power of a laser light required for an activation process, to make it easier to determine a power required for irradiation of a laser light.

H. Sixth Preferred Embodiment

Figure 36:
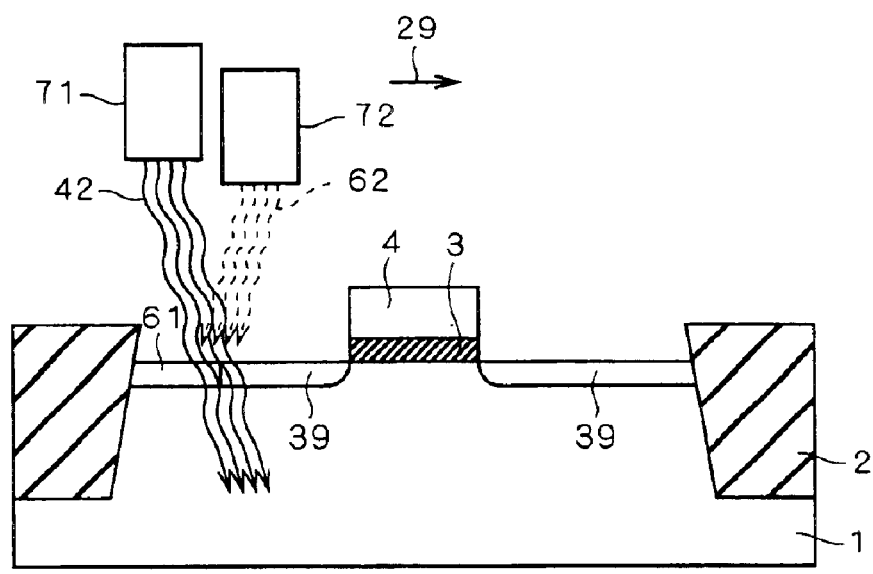
FIG. 36 is a sectional view for illustrating a method of manufacturing a semiconductor device according to a sixth preferred embodiment of the present invention.

FIG. 36 is a sectional view for illustrating a method of manufacturing a semiconductor device according to a sixth preferred embodiment. The laser beam 42 is irradiated onto the P-type silicon substrate 1 including the portions 39 into which ions are implanted, in the same manner as illustrated in FIG. 26. In accordance with the sixth preferred embodiment, a laser beam 62 for heating, together with the laser beam 42, is irradiated onto the P-type silicon substrate 1. The laser beams 42 and 62 move in the direction of the arrow 29, while being irradiated onto the substantially same portion of the P-type silicon substrate 1. The laser beams 42 and 62 are irradiated by using laser light irradiating apparatus 71 and 72, respectively, for example.

A portion which is irradiated with the laser beam 62 for heating is heated to an appropriate temperature equal to or lower than a melting point, so that thermal vibration of atoms is caused in the corresponding portion. Accordingly, irradiation of the laser beam 62 removes crystal defects in the respective surfaces of the P-type silicon substrate 1 including the portions 39 and the polysilicon gate 4, to re-crystallize an amorphous portion and arrange atoms which have been implanted and positioned off proper positions of a silicon lattice, to put them in proper positions of a silicon lattice.

On the other hand, the laser beam 42 capable of causing phonon absorption of silicon is absorbed by an inside of silicon, to cause lattice vibration of silicon. The thermal vibration caused by irradiation of the laser beam 62 accelerates re-arrangement of atoms which is to be caused by irradiation of the laser beam 42.

In the sixth preferred embodiment, both the laser beam 42 and 62 contribute to lattice vibration of silicon. As a result, a time for heating the P-type silicon substrate 1 using the laser beam 62 for heating is reduced, so that thermal diffusion of implanted atoms can not easily occur.

Figure 37:
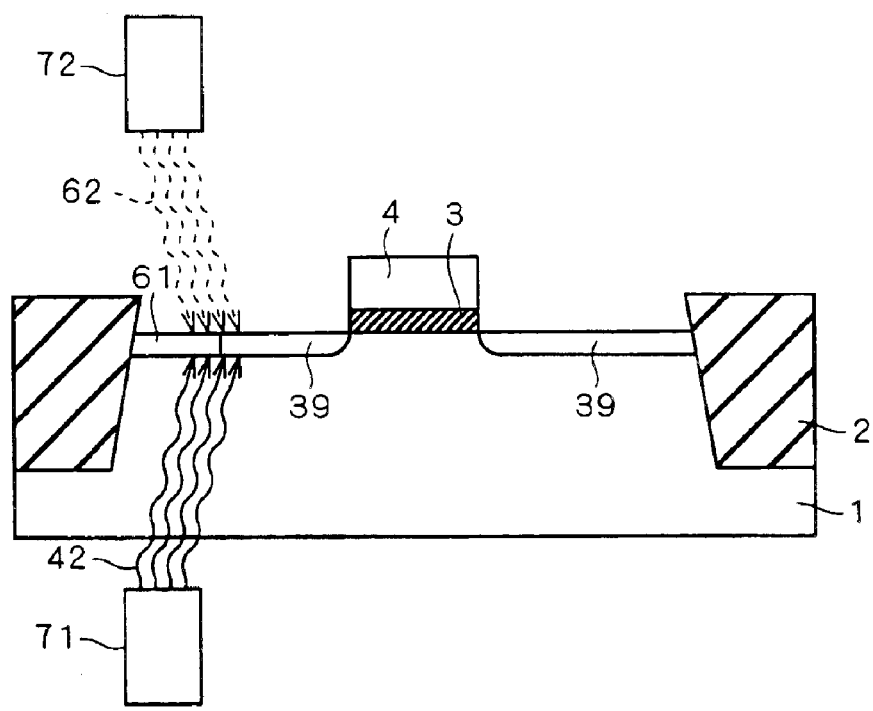
FIG. 37 is a sectional view for illustrating a method of manufacturing a semiconductor device according to a modification of the sixth preferred embodiment of the present invention.

FIG. 37 illustrates a modification of the sixth preferred embodiment. The laser beam 62 for heating and the laser beam 42 capable of causing phonon absorption are irradiated onto the P-type silicon substrate 1 from opposite faces, respectively, while the laser beam 62 is irradiated from the face in which the portions 39 having ions implanted thereinto are formed. This is possible because the laser beam 42 can transmit through silicon at a high transmittance as described above.

The laser beams 42 and 62 may be irradiated either at the same time or at different times, so long as respective irradiations of the laser beams 42 and 62 mutually enhance their effects. Further, respective diameters of the laser beams 42 and 62 may not necessarily be identical to each other, so long as respective irradiations of the laser beams 42 and 62 mutually enhance their effects.

As described above, the sixth preferred embodiment utilizes different effects respectively produced by two types of laser beams. As a result, it is possible to reduce each laser power as compared to a situation where only one type of laser beam is irradiated. This makes it easier to determine a power required of a laser light.

I. Seventh Preferred Embodiment

Figure 38:
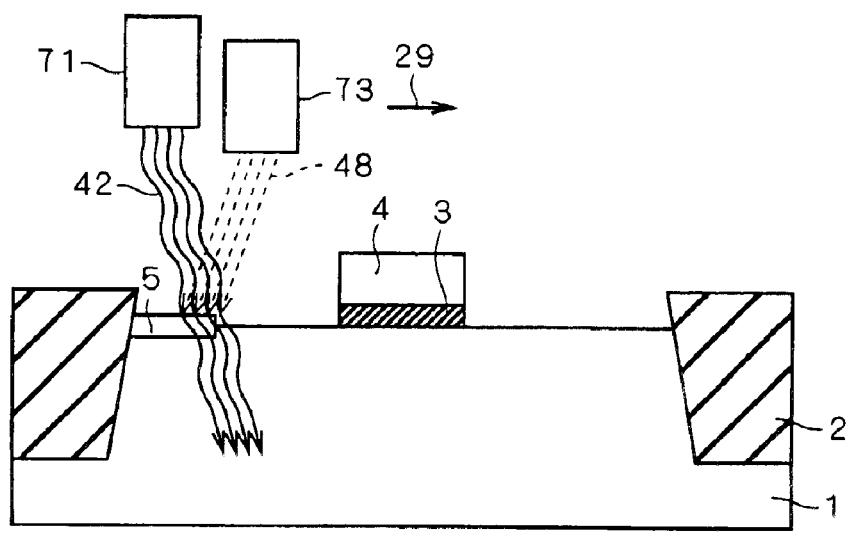
FIG. 38 is a sectional view for illustrating a method of manufacturing a semiconductor device according to a seventh preferred embodiment of the present invention.

FIG. 38 is a sectional view for illustrating a method of manufacturing a semiconductor device according to a seventh preferred embodiment. An ion beam 48 providing N-type impurities, together with the laser beam 42 capable of causing phonon absorption, is irradiated onto the P-type silicon substrate 1 which is provided with the oxide films 2, the gate oxide film 3 and the polysilicon gate 4, while moving in the direction of the arrow 29. The laser beam 42 is irradiated by the laser light irradiation apparatus 71, while the ion beam 48 is irradiated by an ion implantation apparatus 73.

By irradiating the laser beams 42 and the ion beam 48 onto respective portions positionally close to each other, it is possible to accomplish ion implantation and activation of implanted ions at the substantially same time in forming the shallow N-type layers 5. In other words, an impurity introduction process and an activation process can be accomplished in parallel with each other, to simplify associated processes. Further, it is possible to keep the depth of the shallow N-type layers 5 as finished substantially in accordance with distribution of ions to be provided at the time of ion implantation. Thus, a pn junction having an extremely small depth from the surface on which the polysilicon gate 4 is formed can be obtained.

Figure 39:
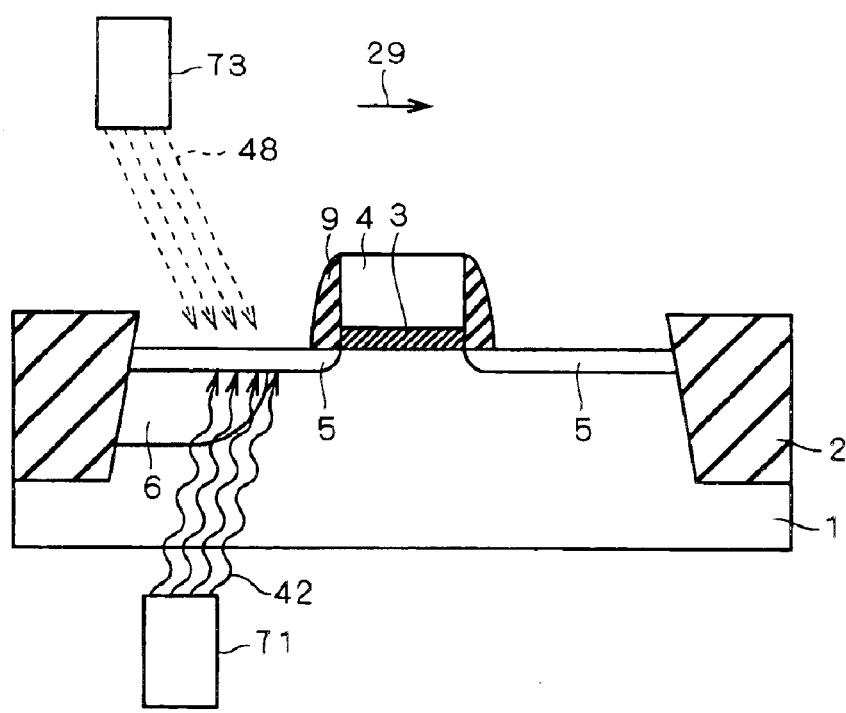
FIG. 39 is a sectional view for illustrating a method of manufacturing a semiconductor device according to a modification of the seventh preferred embodiment of the present invention.

FIG. 39 illustrates a modification of the seventh preferred embodiment. The ion beam 48 and the laser beam 42 are irradiated onto the P-type silicon substrate 1 from opposite faces, respectively, while the ion beam 48 is irradiated from the face in which the polysilicon gate 4 is formed. This is possible because the laser beam 42 can transmit through silicon at a high transmittance, as described above. It is noted that though FIG. 39 illustrates formation of the deep N-type layers 6, irradiation of the laser beam 42 and the ion beam 48 onto the P-type silicon substrate 1 from opposite faces can be employed also for formation of the shallow N-type layers 5.

The laser beams 42 and 62 may be irradiated either at the same time or at different times, so long as respective irradiations of the laser beams 42 and 62 mutually enhance their effects. Further, respective diameters of the laser beams 42 and 62 may not necessarily be identical to each other, so long as respective irradiations of the laser beams 42 and 62 mutually enhance their effects.

While the invention has been shown and described in detail, the foregoing description is in all aspects illustrative and not restrictive. It is therefore understood that numerous modifications and variations can be devised without departing from the scope of the invention.

What is claimed is:

1. A method of manufacturing a semiconductor device comprising the steps of:
   (a) forming a first impurity layer by introducing first impurities which impart a first conductivity type to a semiconductor, into said semiconductor; and
   (b) irradiating a coherent light onto said semiconductor under said first impurity layer,
   wherein said coherent light has a wavelength at which multi-phonon lattice absorption of said semiconductor occurs.

2. The method of manufacturing a semiconductor device according to claim 1, wherein said multi-phonon lattice absorption is absorption of two phonons including an optical phonon and an acoustic phonon.

3. The method of manufacturing a semiconductor device according to claim 2,
   wherein each of said optical phonon and said acoustic phonon both of which contribute to said absorption of said two phonons provides a transverse vibration mode.

4. The method of manufacturing a semiconductor device according to claim 3,
   wherein said semiconductor is silicon, and
   said wavelength of said coherent light is in a range of 16 to 17 $\mu$m.

5. The method of manufacturing a semiconductor device according to claim 4,
   wherein said coherent light is a pulsed laser light including pulses in a range of several femtoseconds to several nanoseconds.

6. The method of manufacturing a semiconductor device according to claim 1,
   wherein said step (a) includes forming a second impurity layer by introducing second impurities which impart a second conductivity type different from said first conductivity type to said semiconductor, into said semiconductor, and introducing said first impurities into said second impurity layer to form said first impurity layer.

7. A method of manufacturing a semiconductor device comprising the steps of:
   (a) forming an impurity layer by introducing impurities into a surface of a silicon layer having a first conductivity type, said impurities imparting a second conductivity type opposite to said first conductivity type to said silicon layer; and
   (b) irradiating a first laser light having a wavelength in a range of 16 to 17 $\mu$m onto said silicon layer.

8. A method of manufacturing a semiconductor device comprising the steps of:
   (a) forming an impurity layer by introducing impurities into a surface of a silicon layer having a first conductivity type, said impurities imparting a second conductivity type opposite to said first conductivity type to said silicon layer; and
   (b) irradiating a first laser light having a wavelength in a range of 16 to 17 $\mu$m onto said silicon layer,
   wherein said step (a) includes the steps of:
   (a-1) introducing said impurities into said surface of said silicon layer to a first depth; and
   (a-2) introducing said impurities into said surface of said silicon layer to a second depth different from said first depth, and
   said first laser light is irradiated onto each of said impurities introduced in said steps (a-1) and (a-2) in said step (b).

9. The method of manufacturing a semiconductor device according to claim 8,
   wherein said first laser light is irradiated onto said silicon layer from a face opposite to said surface from which said impurities are introduced in said step (b).

10. The method of manufacturing a semiconductor device according to claim 9, further comprising the step of:
    (c) forming a metal layer used for silicidation on said surface of said silicon layer, between said steps (a) and (b),
    wherein said first laser light is irradiated onto said metal layer together with said silicon layer in said step (b).

11. The method of manufacturing a semiconductor device according to claim 8,
    wherein said first laser light is incident upon on said silicon layer, and is reflected to be again incident upon said silicon layer in said step (b).

12. The method of manufacturing a semiconductor device according to claim 8,
    wherein said silicon layer is mounted on a holder which scatters said first laser light in said step (b).

13. The method of manufacturing a semiconductor device according to claim 8,
    wherein said silicon layer is mounted on a holder which absorbs said first laser light in said step (b).

14. The method of manufacturing a semiconductor device according to claim 8,
    wherein a second laser light for heating, together with said first laser light, is irradiated onto said silicon layer in said step (b).

15. The method of manufacturing a semiconductor device according to claim 14,
    wherein said second laser light is irradiated onto said silicon layer from a face opposite to said surface of said silicon layer from which said impurities are introduced, and said first laser light is irradiated onto said silicon layer from said surface of said silicon layer from which said impurities are introduced.

16. The method of manufacturing a semiconductor device according to claim 8,
    wherein said steps (a) and (b) are carried out in parallel with each other.

17. The method of manufacturing a semiconductor device according to claim 8,
    wherein said first laser light is irradiated onto said silicon layer from a face opposite to said surface from which said impurities are introduced.

18. The method of manufacturing a semiconductor device according to claim 1,
    wherein said semiconductor is silicon.

19. The method of manufacturing a semiconductor device according to claim 1,
    wherein said multi-phonon lattice absorption of said semiconductor occurs from interaction of said coherent light and a plurality of phonons having different modes.

* * * * *